United States Patent
An et al.

(10) Patent No.: US 10,145,888 B2
(45) Date of Patent: Dec. 4, 2018

(54) ELECTRONIC DEVICE INCLUDING CONNECTORS AND METHOD OF OPERATING THE SAME

(71) Applicant: Samsung Electronics Co., Ltd., Suwon-si, Gyeonggi-do (KR)

(72) Inventors: Jungchul An, Hwaseong-si (KR); Dohee Kang, Suwon-si (KR); Hyun-Woo Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 131 days.

(21) Appl. No.: 15/045,831

(22) Filed: Feb. 17, 2016

(65) Prior Publication Data

US 2016/0238651 A1    Aug. 18, 2016

(30) Foreign Application Priority Data

Feb. 17, 2015    (KR) .................. 10-2015-0024524

(51) Int. Cl.
| | | |
|---|---|---|
| *G01R 31/04* | (2006.01) | |
| *G01R 19/15* | (2006.01) | |
| *H01R 13/641* | (2006.01) | |
| *H01R 12/71* | (2011.01) | |

(52) U.S. Cl.
CPC .......... *G01R 31/043* (2013.01); *G01R 19/15* (2013.01); *G01R 31/04* (2013.01); *G01R 31/046* (2013.01); *H01R 13/641* (2013.01); *H01R 12/716* (2013.01)

(58) Field of Classification Search
CPC .... G01R 31/04; G01R 31/043; G01R 31/041; G01R 31/045; G01R 31/046

USPC .......................................................... 324/538
See application file for complete search history.

(56) References Cited

U.S. PATENT DOCUMENTS

| | | | |
|---|---|---|---|
| 6,213,791 B1 | 4/2001 | Kodama | |
| 8,891,216 B2* | 11/2014 | Mullins | H04M 3/08 |
| | | | 361/58 |
| 2008/0246433 A1* | 10/2008 | Kim | H01M 10/44 |
| | | | 320/103 |
| 2008/0268711 A1 | 10/2008 | Miyazaki et al. | |
| 2010/0035461 A1 | 2/2010 | Berke | |
| 2010/0112830 A1 | 5/2010 | Hirashima | |
| 2013/0210270 A1 | 8/2013 | Takeuchi et al. | |
| 2013/0244452 A1 | 9/2013 | Huang et al. | |
| 2014/0176154 A1* | 6/2014 | Kim | G01R 31/041 |
| | | | 324/538 |

FOREIGN PATENT DOCUMENTS

| | | |
|---|---|---|
| CN | 103155292 A | 6/2013 |
| CN | 103311696 A | 9/2013 |
| EP | 2 211 228 A2 | 7/2010 |
| JP | H11074023 A | 3/1999 |
| JP | 10-2011-243332 A | 12/2011 |
| JP | 2013145687 A | 7/2013 |

(Continued)

*Primary Examiner* — Amy He
(74) *Attorney, Agent, or Firm* — Jefferson IP Law, LLP

(57) ABSTRACT

An electronic device is provided. The device includes a first connector configured to couple with a second connector and including a plurality of contacts separated from each other, and a processor configured to detect an incomplete connection between the first connector and the second connector when an electric current does not flow through at least one of the contacts.

15 Claims, 20 Drawing Sheets

(56) References Cited

FOREIGN PATENT DOCUMENTS

| KR | 10-2008-0095757 A | 10/2008 |
|----|-------------------|---------|
| KR | 10-2010-0107186 A | 10/2010 |
| KR | 10-2014-0039637 A | 4/2014 |
| WO | 2012006086 A | 1/2012 |
| WO | 2013/005076 A1 | 1/2013 |

* cited by examiner

ELECTRONIC DEVICE INCLUDING CONNECTORS AND METHOD OF OPERATING THE SAME

CROSS-REFERENCE TO RELATED APPLICATION(S)

The present application claims the benefit under 35 U.S.C. § 119(a) of a Korean patent application filed on Feb. 17, 2015 in the Korean Intellectual Property Office and assigned Serial number 10-2015-0024524, the entire disclosure of which is hereby incorporated by reference.

TECHNICAL FIELD

The present disclosure relates to an electronic device. More particularly, the present disclosure relates to an electronic device including connectors which electrically interconnect electrical elements and a method of operating the same.

BACKGROUND

Based on advances in an electronic communication industry, a user device (e.g., an electronic device, such as a cellular phone, an electronic notebook, a personal digital assistant (PDA), a laptop computer, and the like) becomes one of necessities in modern life and serves as an important form for fast-changing information delivery.

Such a user device includes various electronic parts to perform various functions. The electronic parts systematically operate through electrical connections. Mostly, the electronic parts can be electrically connected based on connectors (e.g., a male connector, a female connector).

When two connectors of the related art are not connected correctly, they can be disconnected by a little impact. As a result, the electronic device can malfunction.

Therefore, a need exists for an electronic device for detecting an incomplete connection between connectors and guiding a complete connection between the connectors.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device for detecting an incomplete connection between connectors and guiding a complete connection between the connectors.

In accordance with an aspect of the present disclosure, an electronic device is provided. The electronic device includes a first connector configured to couple with a second connector and including a plurality of contacts separated from each other, and a processor configured to detect an incomplete connection between the first connector and the second connector when an electric current does not flow through at least one of the contacts.

In accordance with another aspect of the present disclosure, a method for operating an electronic device including a first connector and a second connector is provided. The method includes detecting no electric current flow of at least one of joints between the first connector and the second connector, and notifying, in response to no electric current flow detected, a connection failure between the first connector and the second connector.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
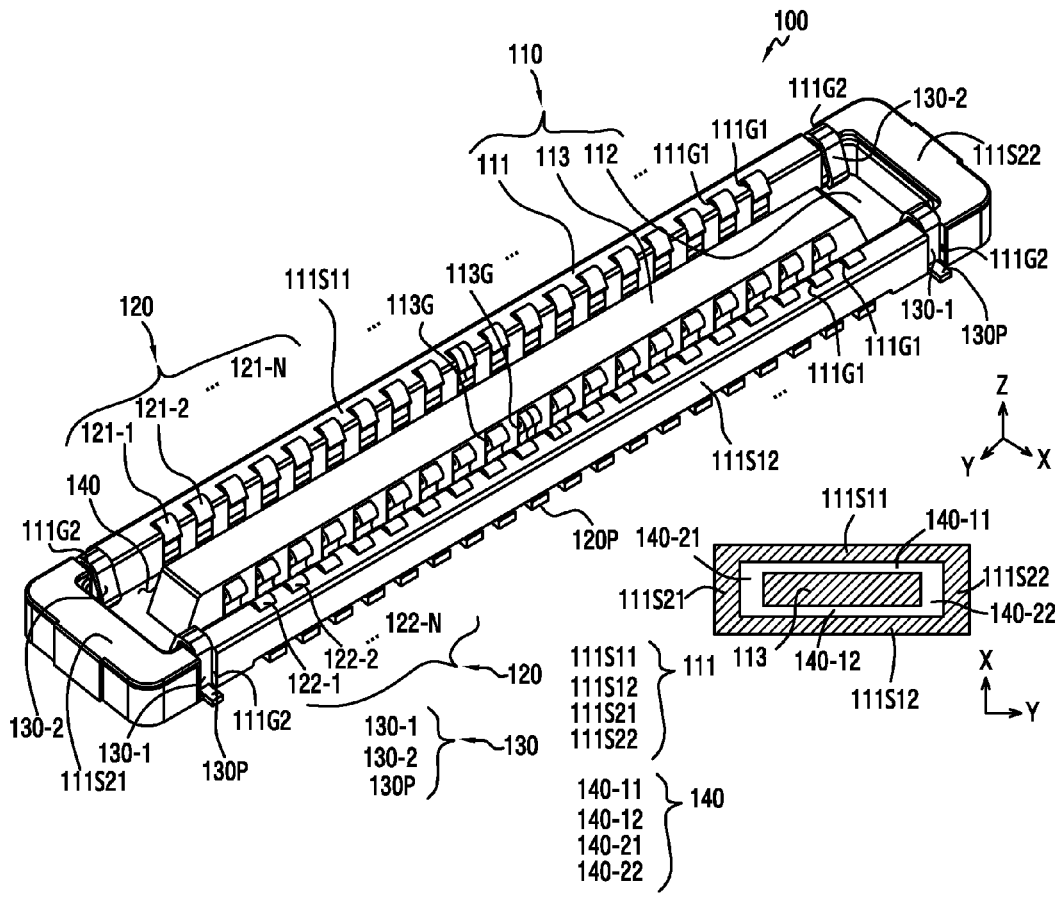
FIG. 1 illustrates a socket connector according to an embodiment of the present disclosure.
Figure 1:
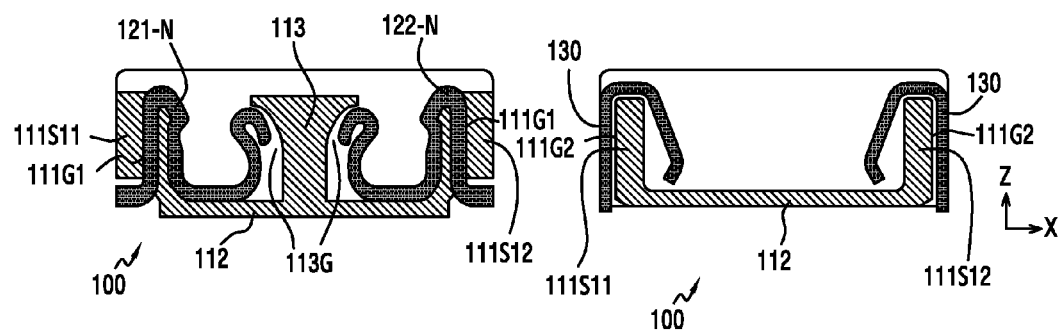

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value needs not be achieved exactly, but that deviations or variations, including for example, tolerances, measurement errors, measurement accuracy limitations and other factors known to those of skill in the art, may occur in amounts that do not preclude the effect the characteristic was intended to provide.

As used in the present disclosure, terms, such as "include", "may include", and the like, refer to the presence of the corresponding function, operation or feature, and do not limit the presence of additional functions, operations or features. In addition, terms, such as "include", "have", and the like, as used in the present disclosure refer to the presence of characteristics, numbers, steps, operations, components or combinations thereof, and are not intended to exclude one or more additional characteristics, numbers, steps, operations, components or combinations thereof. As used in the present disclosure, the term "or", and the like, is used to include any and all combination of terms listed. For examples, "A or B" includes only A, only B, or both A and B.

Although expressions used in various embodiments of the present disclosure, such as "1st", "2nd", "first", "second", and the like, may be used to express various constitutional elements, it is not intended to limit an order and/or importance thereof. The above expressions may be used to distinguish one element from another element. For example, a 1st user device and a 2nd user device may indicate different user devices irrespective of an order or importance thereof. For example, a 1st element may be termed a 2nd element, and similarly, the 2nd element may be termed the 1st element without departing from the scope of the present disclosure.

When a certain element (e.g., the 1st element) is mentioned as being "operatively or communicatively coupled with/to" or "connected to" a different element (e.g., the 2nd element), it is to be understood that the certain element is directly coupled with/to the different element or can be coupled with/to the different element via another element (e.g., a 3rd constitutional element). On the other hand, when the certain element (e.g., the 1st element) is mentioned as being "directly coupled with/to" or "directly connected to" the different element (e.g., the 2nd element), it may be understood that another element (e.g., the 3rd constitutional element) is not present between the certain element and the different element.

An expression "configured to" used in the present disclosure may be interchangeably used with, for example, "suitable for", "having the capacity to", "designed to", "adapted to", "made to", or "capable of" according to a situation. A term "configured to" may not imply only "specially designed to" in a hardware manner. Instead, in a certain situation, an expression "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., central processing unit (CPU) or an application processor) capable of performing corresponding operations by executing one or more software programs stored in a memory device.

Unless otherwise defined, all terms (including technical and scientific terms) used herein have the same meaning as commonly understood by those ordinarily skilled in the art to which various embodiments of the present disclosure belong. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the present document should not be interpreted to exclude the various embodiments of the present disclosure.

An electronic device according to various embodiments of the present disclosure can be a device having communication functionality. For example, the electronic device can include at least one of a smart phone, a tablet personal computer (PC), a mobile phone, a video phone, an e-book reader, a desktop PC, a laptop PC, a netbook computer, a personal digital assistant (PDA), a portable multimedia player (PMP), a moving picture experts group phase 1 or phase 2 (MPEG-1 or MPEG-2) audio layer 3 (MP3) player, a mobile medical device, a camera, and a wearable device (e.g., a head-mounted-device (HMD), such as smart glasses, an electronic tattoo, a smart watch, and the like).

According to various embodiments of the present disclosure, the electronic device can be a smart home appliance having communication functionality. For example, the smart home appliance can include at least one of a television (TV), a digital versatile disc (DVD) player, an audio device, a refrigerator, an air conditioner, a cleaner, an oven, a microwave oven, a washing machine, an air purifier, a set-top box, a TV box (e.g., Samsung HomeSync™, Apple TV™, or Google TV™), a game console, an electronic dictionary, a digital key, a camcorder, and a digital frame.

According to various embodiments of the present disclosure, the electronic device can include at least one of various medical devices (e.g., magnetic resonance angiography (MRA), magnetic resonance imaging (MRI), computed tomography (CT), imaging equipment, ultrasonic instrument, and the like), a navigation device, a global positioning system (GPS) receiver, an event data recorder (EDR), a flight data recorder (FDR), a car infotainment device, an electronic equipment for a ship (e.g., a vessel navigation device, a gyro compass, and the like), avionics, a security device, a vehicle head unit, an industrial or domestic robot, an automatic teller machine (ATM) of a financial institution, and a point of sales (POS) of a retail shop, and devices associated with the Internet of things (e.g., a light bulb, various sensors, an electric or gas meter, a sprinkler device, a fire alarm, a thermostat, a streetlamp, a toaster, fitness equipment, a hot water tank, a heater, a boiler, and the like).

According to various embodiments of the present disclosure, the electronic device can include at least one of furniture having communication functionality, a part of a building/construction, an electronic board, an electronic signature receiving device, a projector, and various measurement machines (e.g., water supply, electricity, gas, propagation measurement machine, and the like). In various embodiments of the present disclosure, the electronic device can be one or more combinations of the aforementioned various devices. In an embodiment of the present disclosure, the electronic device can be a flexible device. In addition, the electronic device according to various embodiments of the present disclosure is not limited to the aforementioned devices, and can include a new electronic device based on technical advances.

Hereinafter, an electronic device according to various embodiments of the present disclosure will be described with reference to the accompanying drawings. In the present document, a term 'user' can refer to a person who uses the electronic device or a device which uses the electronic device (e.g., an artificial intelligence (AI) electronic device).

FIG. 1 illustrates a socket connector according to an embodiment of the present disclosure.

Referring to FIG. 1, a socket connector 100 may include a socket housing 110, a plurality of first socket contacts 120, and at least one second socket contact 130.

The socket housing 110 may be substantially rectangular. The socket housing 110 may include a perimeter wall portion 111, a bottom portion 112, and an island portion 113. The perimeter wall portion 111 may be formed in a substantially regular ring shape along a peripheral edge portion of the socket housing 110. The perimeter wall portion 111 may include a first long wall 111S11 and a second long wall 111S12 on opposite sides respectively. The perimeter wall portion 111 may include a first short wall 111S21 and a second short wall 111S22 on opposite sides respectively. The first short wall 111S21 may interconnect one end of the first long wall 111S11 and one end of the second long wall 111S12. The second short wall 111S22 may interconnect the other end of the first long wall 111S11 and the other end of the second long wall 111S12.

The bottom portion 112 may be disposed at the bottom inside the perimeter wall portion 111. For example, the perimeter wall portion 111 and the bottom portion 112 together may form a rectangular receptacle including an open upper part (e.g., in a z-axis direction).

The island portion 113 may be disposed inside the perimeter wall portion 111 and surrounded by the perimeter wall portion 111. The island portion 113 may be isolated from the perimeter wall portion 111 and disposed on the bottom portion 112.

Figure 4:
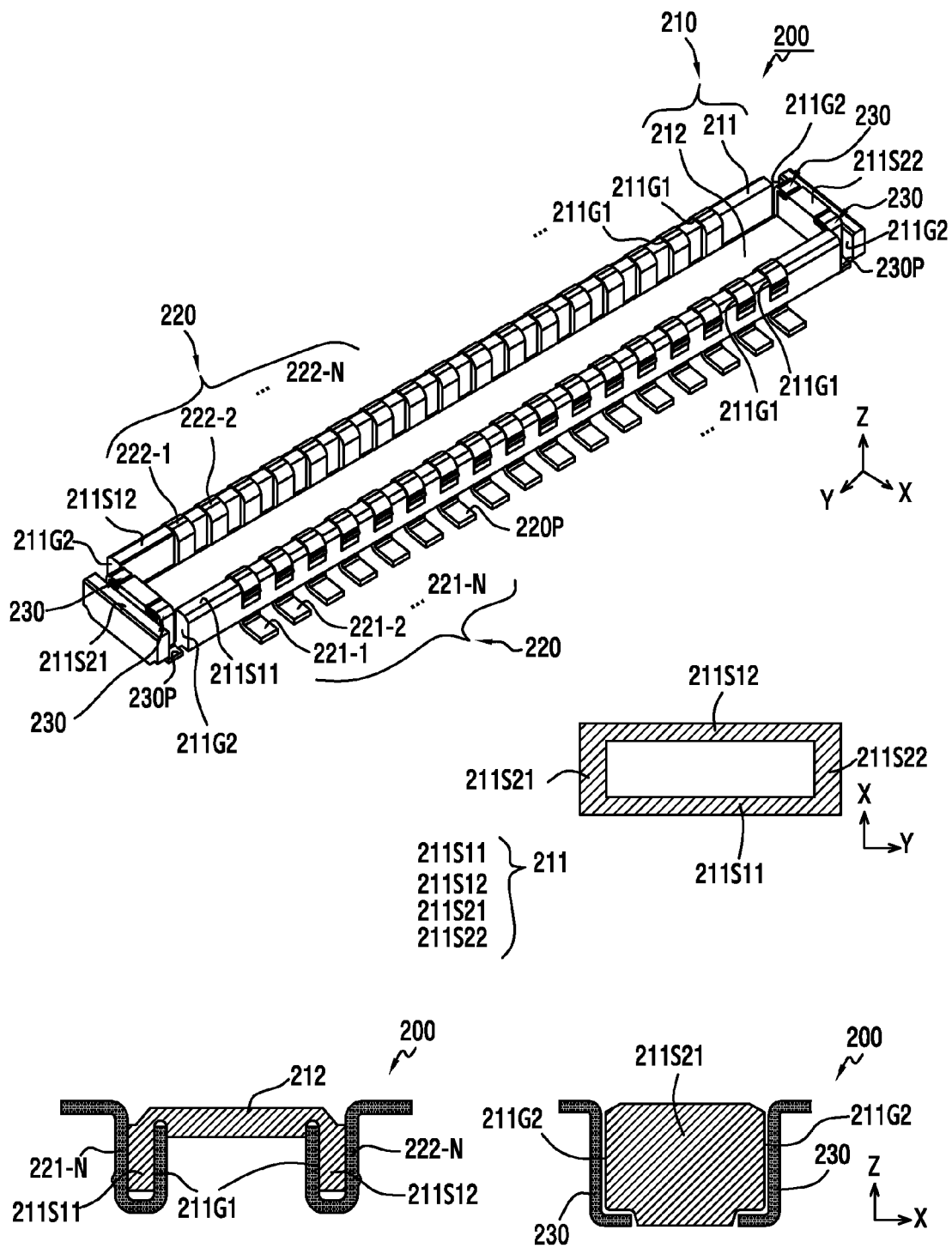
FIG. 4 illustrates a header connector according to an embodiment of the present disclosure.

A fitting groove portion 140 for fitting a header connector 200 of FIG. 4 may be formed between the perimeter wall portion 111 and the island portion 113. The fitting groove portion 140 may be in a rectangular annular shape. For example, the fitting groove portion 140 may include a first long groove 140-11 and a second long groove 140-12 on opposite sides respectively. The fitting groove portion 140 may include a first short groove 140-21 and a second short groove 140-22 on opposite sides respectively. The first long groove 140-11 may include a space between the first long wall 111S11 of the perimeter wall portion 111 and the island portion 113. The second long groove 140-12 may include a space between the second long wall 111S12 of the perimeter wall portion 111 and the island portion 113. The first short groove 140-21 may include a space between the first short wall 111S21 of the perimeter wall portion 111 and the island portion 113. The second short groove 140-22 may include a space between the second short wall 111 S22 of the perimeter wall portion 111 and the island portion 113.

The first and second short walls 111S21 and the 111S22 of the perimeter wall portion 111 may reinforce strength so as to prevent deformation (e.g., distortion, bending, and the like) of the rectangular socket housing 110. On a plane (e.g., a XY plane), the first and second short walls 111S21 and the 111S22 of the socket housing 110 may be wider than the first and second long walls 111S11 and the 111S12 of the socket housing 110.

The plurality of the first socket contacts 120 may be distributed to the pair of the long grooves 140-11 and 140-12 facing each other in the fitting groove portion 140. For example, the first socket contacts 120 may be arranged in two rows. The first socket contacts 120 may be separated at regular or irregular intervals. The first socket contacts 120 may include at least one 1-1 socket contact 121-N coupled to the first long wall 111S11 of the perimeter wall portion 111. The first socket contacts 120 may include at least one 1-2 socket contact 122-N coupled to the second long wall 111S12 of the perimeter wall portion 111. Alternatively, although not depicted, at least one of the first socket contacts 120 may be disposed on at least one of the first short wall 111S21 and the second short wall 111S22 of the perimeter wall portion 111.

The first socket contacts 120 may be in a substantially similar shape. For example, the first socket contacts 120 may include a U-shaped front end portion 120-1 which provides a space for fitting a contact of the head connector 200 of FIG. 4. The front end portion 120-1 may be disposed in the fitting groove portion 140 of the socket housing 110. When the socket connector 100 and the header connector 200 are coupled, the contact (not shown) of the header connector 200 may slidingly contact an inner side of the front end portion 120-1 of the first socket contacts 121-N and 122-N and enter the front end portion 120-1 of the first socket contacts 121-N and 122-N. Herein, the front end portion 120-1 of the first socket contacts 121-N and 122-N may include a free end 120-1F which may elastically bend so as to elastically press the contact of the header connector 200.

The island portion 113 of the socket housing 110 may include a groove 113G for receiving the free end 120-1F of the first socket contacts 121-N and 122-N.

When the free end 120-1F of the first socket contacts 121-N and 122-N is elastically bent, the free end 120-1F of the first socket contacts 121-N and 122-N may move in the space of the groove 113G of the island portion 113 of the socket housing 110. The first socket contacts 121-N and 122-N may include a base end portion 120-2 extending from the front end portion 120-1. The base end portion 120-2 of the first socket contacts 121-N and 122-N may be fixed to the perimeter wall portion 111 of the socket housing 110. For example, the perimeter wall portion 111 of the socket housing 110 may include a groove 111G1 for mounting the base end portion 120-2 of the first socket contacts 121-N and 122-N. The front end portion 120-1 of the first socket contacts 121-N and 122-N may be elastically bent by the support of the base end portion 120-2 fixed to the perimeter wall portion 111 of the socket housing 110. The base end portion 120-2 of the first socket contacts 121-N and 122-N may include a mounting piece portion 120P extending outwards from the socket housing 110. The mounting piece portion 120P may be secured using soldering on a land (or a copper pad) of a circuit board (not shown).

The first socket contacts 120 may include a ground connecting contact, a device recognizing contact, a data transmitting contact, and a data receiving contact.

The at least one second socket contact 130 may be disposed at various positions. The at least one second socket contact 130 may be disposed on the perimeter wall portion 111. For example, the at least one second socket contact 130 may be disposed on at least one of the first long wall 111S11 and the second long wall 111S12 of the perimeter wall portion 111. Alternatively, although not depicted, the at least one second socket contact 130 may be disposed on at least one of the first short wall 111S21 and the second short wall 111S22 of the perimeter wall portion 111.

According to an embodiment of the present disclosure, the at least one second socket contact 130 may be disposed on the outside than the first socket contacts 120 in a direction from the first short wall 111S21 to the second short wall 111S22 of the perimeter wall portion 111. Alternatively, the at least one second socket contact 130 may be disposed on the outside than the first socket contacts 120 in a direction from the second short wall 111S22 to the first short wall 111S21 of the perimeter wall portion 111.

According to an embodiment of the present disclosure, the at least one second socket contact 130 may be coupled to the first long wall 111S11 of the perimeter wall portion 111, and disposed on the outside than the at least one 1-1 socket contact 121-N coupled to the first long wall 111S11 in a direction from the first short wall 111S21 to the second short wall 111S22. Alternatively, the at least one second socket contact 130 may be coupled to the first long wall 111S11 of the perimeter wall portion 111, and disposed on the outside than the at least one 1-1 socket contact 121-N coupled to the first long wall 111S11 in a direction from the second short wall 111S22 to the first short wall 111S21. The at least one second socket contact 130 may be paired, and the at least one 1-1 socket contact 121-N may be disposed between the paired second socket contacts 130.

According to an embodiment of the present disclosure, the at least one second socket contact 130 may be coupled to the second long wall 111S12 of the perimeter wall portion 111, and disposed on the outside than the at least one 1-2 socket contact 122-N coupled to the second long wall 111S12 in a direction from the first short wall 111S21 to the second short wall 111S22. Alternatively, the at least one second socket contact 130 may be coupled to the second long wall 111S12 of the perimeter wall portion 111, and disposed on the outside than the at least one 1-2 socket contact 122-N coupled to the second long wall 111S12 in a direction from the second short wall 111S22 to the first short wall 111S21. The at least one second socket contact 130 may be paired, and the at least one 1-2 socket contact 122-N may be disposed between the paired second socket contacts 130.

According to various embodiments of the present disclosure, the at least one second socket contact 130 may be disposed on at least one of four corners of the socket housing 110. For example, the at least one second socket contact 130 may be disposed at or near a joint of the first long wall 111S11 and the first short wall 111S21 of the perimeter wall portion 111. Alternatively, the at least one second socket contact 130 may be disposed at or near a joint of the first long wall 111S11 and the second short wall 111S22 of the perimeter wall portion 111. Alternatively, the at least one second socket contact 130 may be disposed at or near a joint of the second long wall 111S12 and the first short wall 111S21 of the perimeter wall portion 111. Alternatively, the at least one second socket contact 130 may be disposed at or near a joint of the second long wall 111S12 and the second short wall 111S22 of the perimeter wall portion 111.

According to various embodiments of the present disclosure, although not depicted, the at least one second socket contact 130 may be disposed between the first socket contacts 120 arranged in a row.

According to various embodiments of the present disclosure, at least one of the first socket contacts 120 may replace the at least one second socket contact 130. For example, the at least one second socket contact 130 may include the outermost one of the first socket contacts 120 arranged in a row, or another one of them.

The position or the number of the at least one second socket contact 130 of the socket connector 100 may vary according to the shape of the socket connector 100.

The at least one second socket contact 130 may be any one of the first socket contacts 120. The shape of the at least one second socket contact 130 may be similar to or the same as the first socket contacts 120.

The shape of the at least one second socket contact 130 may differ from the first socket contacts 120. For example, the at least one second socket contact 130 may include a fixing portion 130-1 coupled to the socket housing 110, and a free end portion 130-2 extending from the fixing portion 130-1 to the fitting groove portion 140 of the socket housing.

The fixing portion 130-1 of the at least one second socket contact 130 may be coupled to the perimeter wall portion 111 of the socket housing 110. Alternatively, although not depicted, the fixing portion 130-1 of the at least one second socket contact 130 may cover at least one side of the perimeter wall portion 111 of the socket housing 110. Alternatively, although not depicted, the fixing portion 130-1 of the at least one second socket contact 130 may further include at least one anchor which digs into the perimeter wall portion 111 of the socket housing 110. Such an anchor may enhance the connection between the fixing portion 130-1 and the socket housing 110.

The at least one second socket contact 130 may be disposed in grooves 111G2 on the pair of the long walls 111S11 and the 111S12 of the perimeter wall portion 111 of the socket housing 110. Alternatively, although not depicted, the at least one second socket contact 130 may be disposed on the pair of the short walls 111S21 and the 111S22 of the perimeter wall portion 111 of the socket housing 110. The at least one second socket contact 130 may include a mounting piece portion 130P extending from the fixing portion 130-1 to the outside of the socket housing 110. The mounting piece portion 130P may be secured by soldering it on the land of the circuit board (not shown).

The free end portion 130-2 of the at least one second socket contact 130 may be elastically bent by the support of the fixing portion 130-1 secured to the socket housing 110. For example, when the contact of the header connector 200 is inserted to the fitting groove portion 140 of the socket housing 110, the free end portion 130-2 of the at least one second socket contact 130 may slidingly contact the contact of the header connector 200 and the free end portion 130-2 of the second socket contact 130 may be elastically bent by the header connector 200.

The at least one second socket contact 130 may be used to determine a connection state between the socket connector 100 and the header connector 200 of FIG. 4, to be explained.

Figure 2:
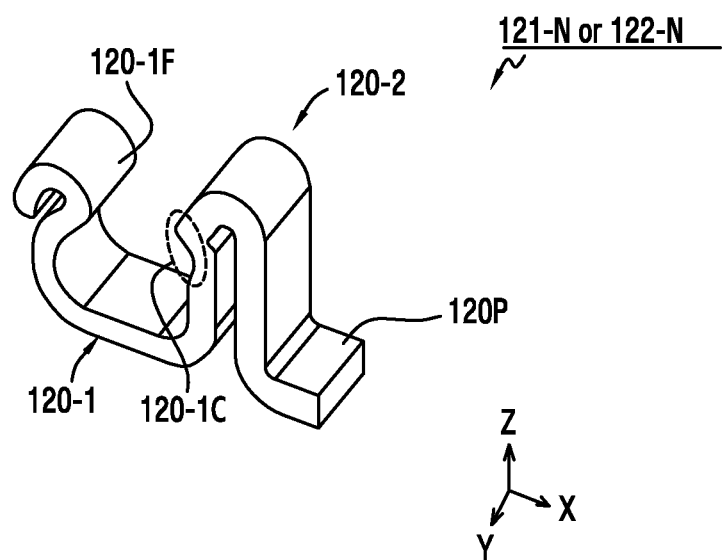
FIG. 2 illustrates a first socket contact according to an embodiment of the present disclosure.

FIG. 2 illustrates a first socket contact according to an embodiment of the present disclosure.

Referring to FIG. 2, the first socket contact 121-N or 122-N may be fabricated by bending a band-shaped metallic material of a certain thickness. The first socket contact 121-N or 122-N may include a U-shaped front end portion 120-1 and an inverse U-shaped base end portion 120-2.

The contact of the header connector 200 of FIG. 4 may be inserted into the U-shaped space of the front end portion 120-1 of the first socket contact 121-N or 122-N. In doing so, the front end portion 120-1 of the first socket contact 121-N or 122-N may slidingly contact the contact of the header connector 200. Herein, the front end portion 120-1 of the first socket contact 121-N or 122-N may include the free end 120-1F which elastically contacts the contact of the header connector 200. The free end 120-1F may contact the contact of the header connector 200 using elastic bending. To concentrate on the contact with the contact of the header connector 200, the free end 120-1F may include a shape which is bent round inside the U-shaped space.

The front end portion 120-1 of the first socket contact 121-N or 122-N may further include a curved convex-concave portion 120-1C inside the U-shaped space near an entrance where the header connector 200 is inserted. The convex-concave portion 120-1C may face the round-bent shape of the free end 120-1F. When the contact of the header connector 200 is inserted to the U-shaped space of the front end portion 120-1 of the first socket contact 121-N or 122-N, a protrusion (not shown) of the contact of the header connector 200 may slidingly contact the curved surface of the convex-concave portion 120-1C under the elastic pressure of the free end 120-1F. The convex shape of the convex-concave portion 120-1C of the first socket contact 121-N or 122-N may hinder the inserted protrusion of the contact of the header connector 200 from deviating (e.g., in a z-axis direction), which may assist in suppressing the disconnection between the first socket contact 121-N or 122-N of the socket connector 100 and the contact of the header connector 200.

The base end portion 120-2 of the first socket contact 121-N or 122-N may be secured to the socket housing 110, and the front end portion 120-1 may be elastically bent like a cantilever with the support of the base end portion 120-2 secured to the socket housing 110. The first socket contact 121-N or 122-N may include the mounting piece portion 120P which is bent outwards from the socket housing 110.

Figure 3:
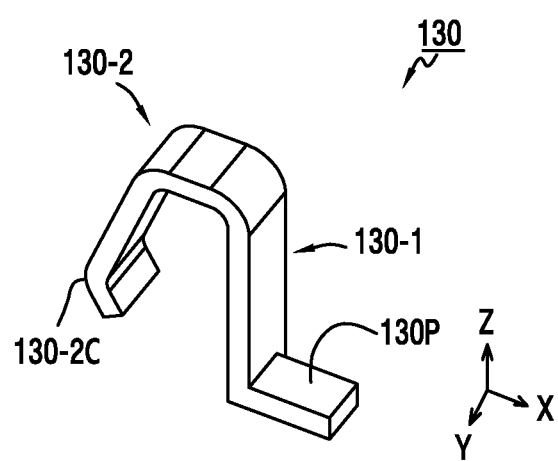
FIG. 3 illustrates a second socket contact according to an embodiment of the present disclosure.

FIG. 3 depicts a second socket contact according to an embodiment of the present disclosure.

Referring to FIG. 3, the second socket contact 130 may be fabricated by bending a band-shaped metallic material of a certain thickness. The second socket contact 130 may surround the perimeter wall portion 111 of the socket housing 110 in a substantially U shape. The second socket contact 130 may include the fixing portion 130-1 and the free end portion 130-2.

The fixing portion 130-1 of the second socket contact 130 may be coupled to an outer side of the perimeter wall portion 111, and extend substantially vertically (e.g., a vertical column). The second socket contact 130 may include the mounting piece portion 130P extending from the fixing portion 130 to the outside of the socket housing 110.

The free end portion 130-2 of the second socket contact 130 may bend to extend from the fixing portion 130-1 into the fitting groove portion 140 of the socket housing 110. The free end portion 130-2 of the second socket contact 130 may include a round-bent shape 130-2C so as to concentrate on the contact with the contact of the header connector 200 of FIG. 4.

The free end portion 130-2 of the second socket contact 130 may elastically bend like a cantilever with the support of the fixing portion 130-1 secured to the socket housing 110. For example, when the contact of the header connector 200 is inserted to the fitting groove portion 140 of the socket housing 110, the free end portion 130-2 of the second socket contact 130 may slidingly contact the contact of the header connector 200 and the free end portion 130-2 of the second socket contact 130 may be elastically bent by the header connector 200.

FIG. 4 illustrates a header connector according to an embodiment of the present disclosure.

Referring to FIG. 4, the header connector 200 may include a header housing 210, a plurality of first header contacts 220, and at least one second header contact 230.

The header housing 210 may be substantially rectangular. The header housing 210 may include a perimeter wall portion 211 and a bottom portion 212. The perimeter wall portion 211 may be formed in a substantially regular ring shape along a peripheral edge portion of the header housing 210. The perimeter wall portion 211 may include a first long wall 211S11 and a second long wall 211S12 on opposite sides respectively. The perimeter wall portion 211 may include a first short wall 211S21 and a second short wall 211S22 on opposite sides respectively. The first short wall 211S21 may interconnect one end of the first long wall 211S11 and one end of the second long wall 211S12. The second short wall 211S22 may interconnect the other end of the first long wall 211S11 and the other end of the second long wall 211S12.

The first and second short walls 211S21 and the 211 S22 of the perimeter wall portion 211 may reinforce strength so as to prevent deformation (e.g., distortion, bending, and the like) of the header housing 210.

The bottom portion 212 may be disposed at the bottom inside the perimeter wall portion 211. For example, the perimeter wall portion 211 and the bottom portion 212 together may form a rectangular receptacle including an open upper part (e.g., in a z-axis direction).

The first header contacts 220 may be distributed on the pair of the long walls 211S11 and 211S12 facing each other in the perimeter wall portion 211 of the header housing 210. For example, the first header contacts 220 may be arranged in two rows. The first header contacts 220 may be separated at regular or irregular intervals.

The first header contacts 220 may include at least one 1-1 header contact 221-N coupled to the first long wall 211S11 of the perimeter wall portion 211. The first header contacts 220 may include at least one 1-2 header contact 222-N coupled to the second long wall 211S12 of the perimeter wall portion 211. Alternatively, although not depicted, at least one of the first header contacts 220 may be disposed on at least one of the first short wall 211S21 and the second short wall 211S22 of the perimeter wall portion 211.

The first header contacts 220 may be disposed on the header housing 210 to correspond to the first socket contacts 120 of the socket connector 100.

The first header contacts 220 may be in a substantially constant shape. For example, the first header contacts 221-N and 222-N may include an inverse U-shaped front end portion 220-1. The perimeter wall portion 211 of the header housing 210 may include a groove 211 G1 received in the U-shaped space of the front end portion 220-1 of the first header contacts 221-N and 222-N. When the socket connector 100 and the header connector 200 are coupled, the first header contacts 221-N and 222-N of the header connector 200 may slidingly contact the first socket contacts 121-N and 122-N of the socket connector 100. The first header contacts 221-N and 222-N may include a mounting piece portion 220P extending to the outside of the header housing 210. The mounting piece portion 220P may be secured on the land of the circuit board (not shown) using soldering.

The at least one second header contact 230 may be disposed on the header housing 210 to correspond to the at least one second socket contact 130 of the socket connector 100. The at least one second header contact 230 may be disposed on the perimeter wall portion 211. For example, the at least one second header contact 230 may be disposed on at least one of the first short wall 211S21 and the second short wall 211S22 of the perimeter wall portion 211. Alternatively, although not depicted, the at least one second header contact 230 may be disposed on at least one of the first long wall 211S11 and the second long wall 211S12 of the perimeter wall portion 211.

According to an embodiment of the present disclosure, the at least one second header contact 230 may be disposed on the outside than the first header contacts 220 in a direction from the first short wall 211S21 to the second short wall 211S22 of the perimeter wall portion 211. Alternatively, the at least one second header contact 230 may be disposed on the outside than the first header contacts 220 in a direction from the second short wall 211S22 to the first short wall 211S21 of the perimeter wall portion 211.

According to an embodiment of the present disclosure, the at least one second header contact 230 may be paired, and the 1-1 socket contacts 221-N may be disposed between the paired second header contacts 230.

According to an embodiment of the present disclosure, the at least one second header contact 230 may be paired, and the 1-2 socket contacts 222-N may be disposed between the paired second header contacts 230.

According to various embodiments of the present disclosure, the at least one second header contact 230 may be disposed on at least one of four corners of the header housing 210. For example, the at least one second header contact 230 may be disposed at or near a joint of the first long wall 211S11 and the first short wall 211S21 of the perimeter wall portion 211. Alternatively, the at least one second header contact 230 may be disposed at or near a joint of the first long wall 211S11 and the second short wall 211S22 of the perimeter wall portion 211. Alternatively, the at least one second header contact 230 may be disposed at or near a joint of the second long wall 211S12 and the first short wall 211S21 of the perimeter wall portion 211. Alternatively, the at least one second header contact 230 may be disposed at or near a joint of the second long wall 211S12 and the second short wall 211S22 of the perimeter wall portion 211.

According to various embodiments of the present disclosure, although not depicted, the at least one second header contact 230 may be disposed between the first header contacts 220 arranged in a row.

According to various embodiments of the present disclosure, at least one of the first header contacts 220 may replace the at least one second header contact 230. For example, the at least one second header contact 230 may include the outermost one of the first header contacts 220 arranged in a row, or another one of them.

The position or the number of the at least one second header contact 230 of the header connector 200 may vary according to the shape of the header connector 200.

The at least one second header contact 230 may include any one of the first header contacts 220. The shape of the second header contact 230 may be similar to or the same as the first header contacts 220.

The shape of the at least one second header contact 230 may differ from the first header contacts 220. For example, the at least one second header contact 230 may include a fixing portion 230-1 coupled to the groove 211G2 of the perimeter wall portion 211 of the header housing 210, and a mounting piece portion 230P extending from the fixing portion 230-1 to the outside of the header housing 210. The mounting piece portion 230P may be secured by soldering on the land of the circuit board (not shown). Alternatively, although not depicted, the fixing portion 230-1 of the at least one second header contact 230 may further include at least one anchor which digs into the perimeter wall portion 211 of the header housing 210. Such an anchor may enhance the connection between the fixing portion 230-1 and the header housing 210.

Figure 5:
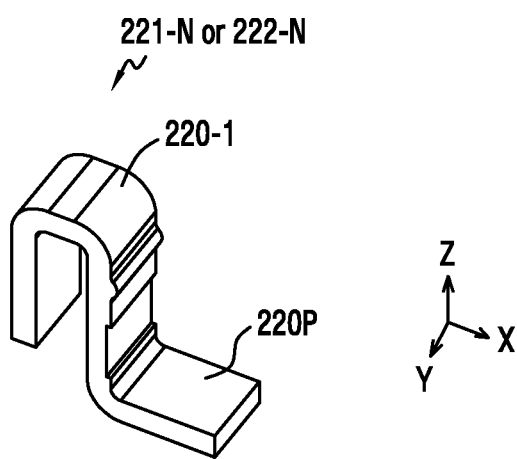
FIG. 5 illustrates a first header contact according to an embodiment of the present disclosure.

FIG. 5 illustrates a first header contact according to an embodiment of the present disclosure.

Referring to FIG. 5, the first header contact 221-N or 222-N may be fabricated by bending a band-shaped metallic material of a certain thickness. The first header contact 221-N or 222-N may include an inverse U-shaped front end portion 220-1 and a mounting piece portion 220P extending from the front end portion 220-1 to the outside of the header housing 210.

Figure 6:
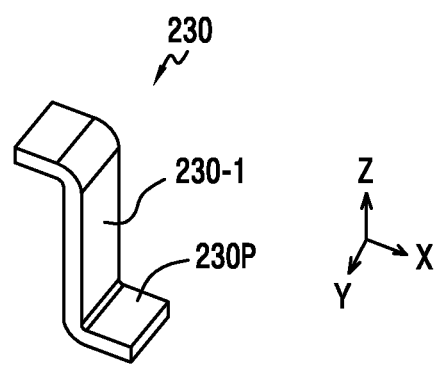
FIG. 6 illustrates a second header contact according to an embodiment of the present disclosure.

FIG. 6 illustrates a second header contact according to an embodiment of the present disclosure.

Referring to FIG. 6, the second header contact 230 may be fabricated by bending a band-shaped metallic material of a certain thickness. The second header contact 230 may include the fixing portion 230-1 coupled to the perimeter wall portion 211 of the header housing 210 and the mounting piece portion 230P extending from the fixing portion 230-1 to the outside of the header housing 210. The fixing portion 230-1 of the second header contact 230 may cover at least one side of the perimeter wall portion 211 of the header housing 210.

An arrangement between the first socket contacts 121-N and 122-N of the socket connector 100 and the first header contacts 221-N and 222-N of the header connector 200 may vary according to the arrangement between the socket connector 100 and the header connector 200. An arrangement between the second socket contact 130 of the socket connector 100 and the second header contact 230 of the header connector 200 may also change according to the arrangement between the socket connector 100 and the header connector 200.

Figure 7A:
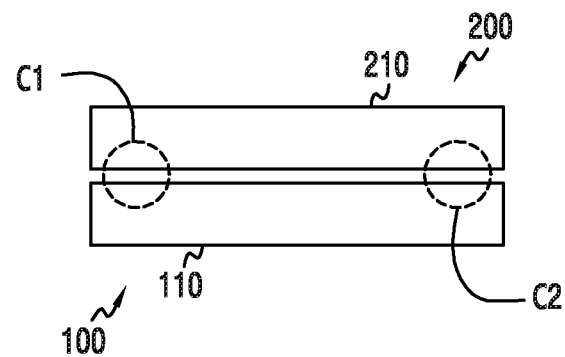
FIGS. 7A and 7B illustrate arrangements of connectors according to an embodiment of the present disclosure.
Figure 7B:
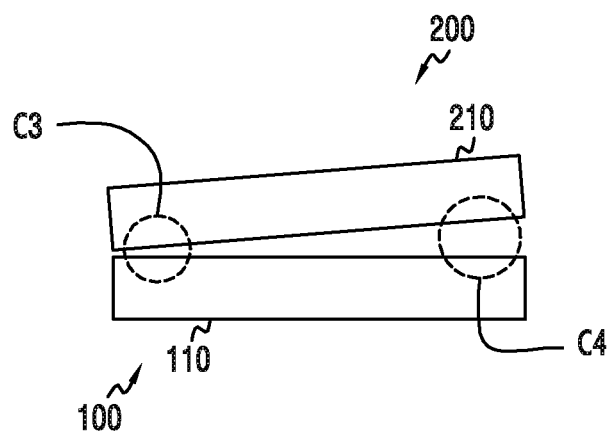

FIGS. 7A and 7B illustrate arrangements of connectors according to an embodiment of the present disclosure.

Referring to FIG. 7A, when distances at several corresponding positions between the socket housing 110 and the header housing 210 are constant, for example, when the socket housing 110 and the header housing 210 are disposed in parallel, the disposition (e.g., a distance) between the contacts at a first position C1 between the socket housing 110 and the header housing 210 and the disposition (e.g., a distance) between the contacts at a second position C2 between the socket housing 110 and the header housing 210 may be consistent. For example, when the distances at the several corresponding positions between the socket housing 110 and the header housing 210 are constant, the disposition between the first socket contact 121-N or 122-N of the socket connector 100 and the first header contact 221-N or 222-N of the header connector 200 may be constant. When the distances at the several corresponding positions between the socket housing 110 and the header housing 210 are constant, the disposition between the second socket contact 130 of the socket connector 100 and the second header contact 230 of the header connector 200 may be constant as well.

Although the distances at the several corresponding positions between the socket housing 110 and the header housing 210 are constant, the disposition between the contacts at the first position C1 between the socket housing 110 and the header housing 210 and the disposition between the contacts at the second position C2 between the socket housing 110 and the header housing 210 may differ from each other. For example, even when the distances at the several corresponding positions between the socket housing 110 and the header housing 210 are constant, the disposition between the first socket contact 121-N or 122-N of the socket connector 100 and the first header contact 221-N or 222-N of the header connector 200 may differ from the disposition between the second socket contact 130 of the socket connector 100 and the second header contact 230 of the header connector 200.

When the connection distance between the socket connector 100 and the header connector 200 is smaller than a reference distance, all of the first socket contacts 120 and the at least one second socket contact 130 of the socket connector 100 may contact the contacts of the header connector 200.

When the connection distance between the socket connector 100 and the header connector 200 is greater than the reference distance, only the first socket contacts 120 may contact the first header contacts 220. For example, when the socket connector 100 and the header connector 200 are coupled, the first socket contacts 120 and the first header contacts 220 may contact and the at least one second socket contact 130 and the at least one second header contact 230 may contact.

Referring to FIG. 7B, when distances at several corresponding positions between the socket housing 110 and the header housing 210 are not constant, for example, when the socket housing 110 and the header housing 210 are not disposed in parallel, the disposition between the contacts at a third position C3 between the socket housing 110 and the header housing 210 may differ from the disposition between the contacts at a fourth position C4 between the socket housing 110 and the header housing 210. For example, when the distances at the several corresponding positions between the socket housing 110 and the header housing 210 are not constant, the disposition between the first socket contact 121-N or 122-N of the socket connector 100 and the first header contact 221-N or 222-N of the header connector 200 may change. Alternatively, when the distances at the several corresponding positions between the socket housing 110 and the header housing 210 are not constant, the disposition between the first socket contact 121-N or 122-N of the socket connector 100 and the first header contact 221-N or 222-N of the header connector 200 may differ from the disposition between the second socket contact 130 of the socket connector 100 and the second header contact 230 of the header connector 200.

Figure 8:
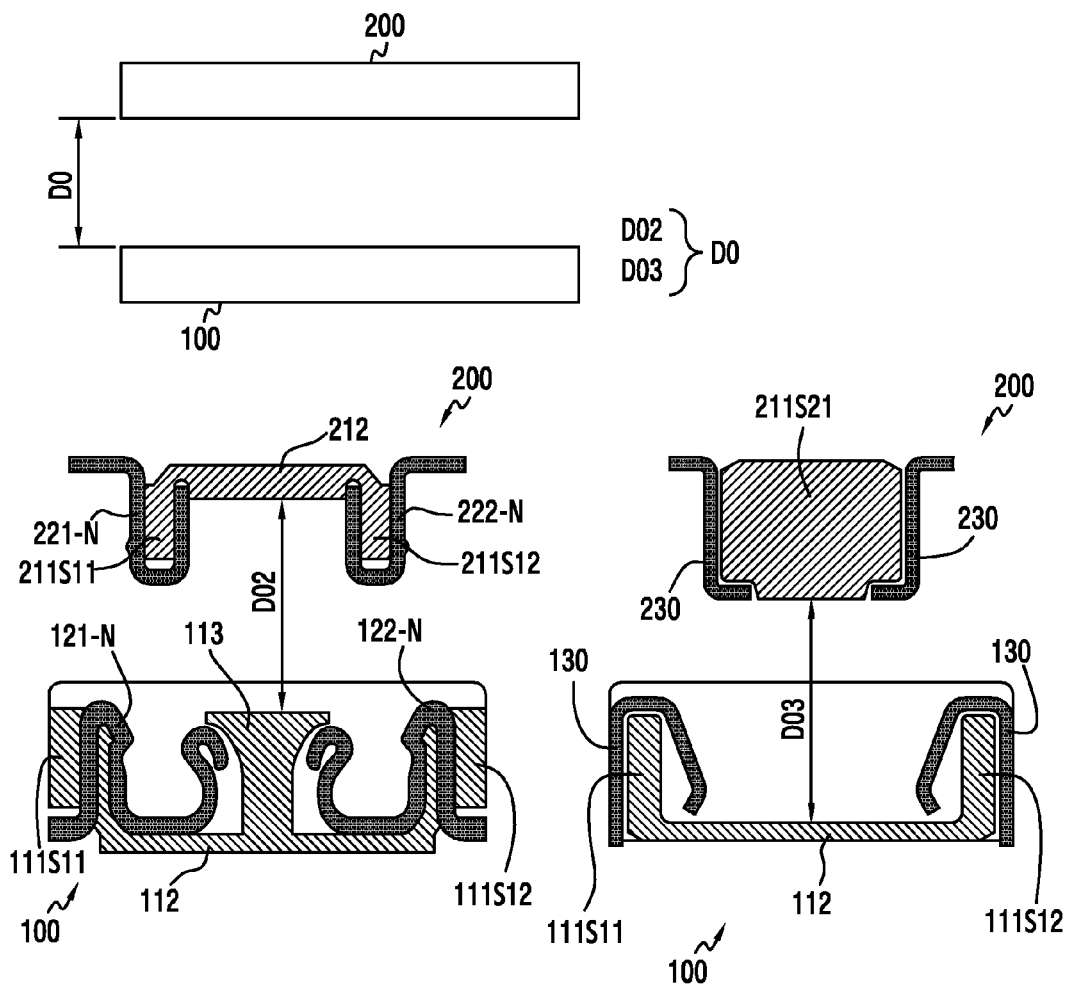
FIG. 8 illustrates a disconnection between a socket connector and a header connector according to an embodiment of the present disclosure.

FIG. 8 illustrates a disconnection between a socket connector and a header connector according to an embodiment of the present disclosure.

Referring to FIG. 8, when the socket contactor 100 and the header connector 200 are detached, the first socket contacts 121-N and 122-N of the socket connector 100 may not contact the first header contacts 221-N and 222-N of the header connector 200. In addition, the at least one second socket contact 130 of the socket connector 100 may not contact the second header contact 230 of the header connector 200.

Figure 9:
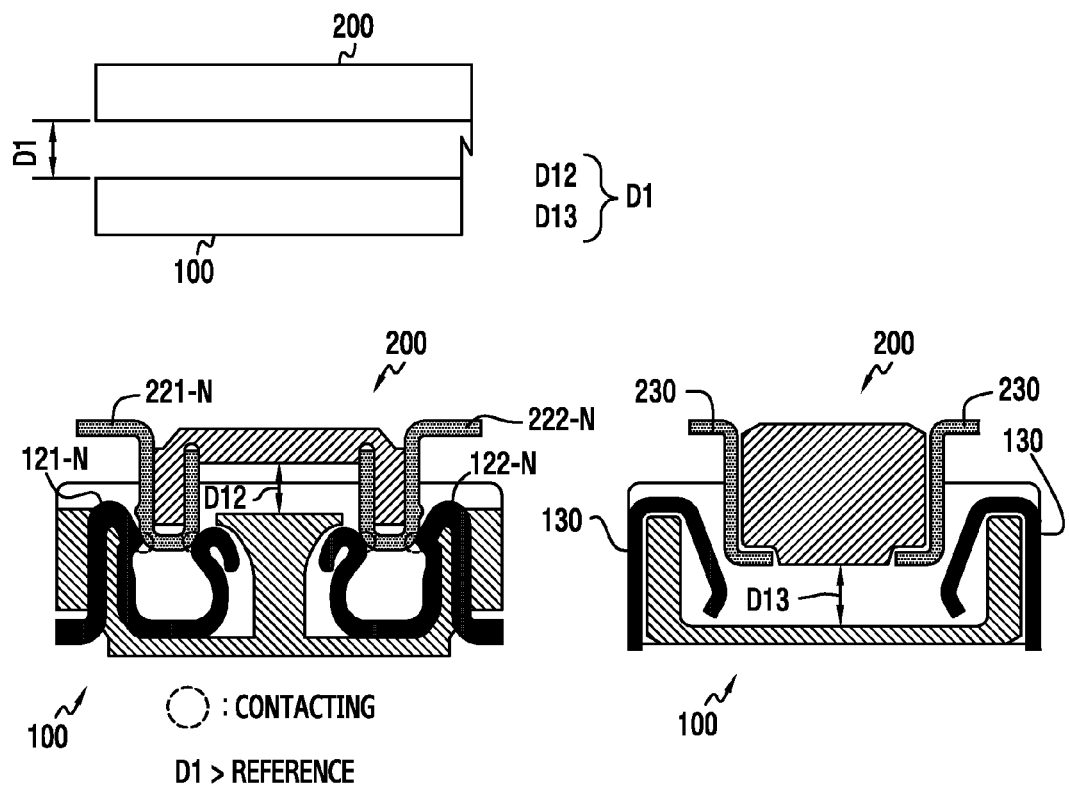
FIG. 9 illustrates a connection between a socket connector and a header connector according to an embodiment of the present disclosure.

FIG. 9 illustrates a connection between a socket connector and a header connector according to an embodiment of the present disclosure.

Referring to FIG. 9, the socket contactor 100 and the header connector 200 are coupled, and a connection distance D1 or a connection level between the socket contactor 100 and the header connector 200 may be greater than a reference distance or level. In this case, the first socket contacts 121-N and 122-N of the socket connector 100 may contact the first header contacts 221-N and 222-N of the header connector 200 whereas the at least one second socket contact 130 of the socket connector 100 may not contact the second header contact 230 of the header connector 200.

Figure 10:
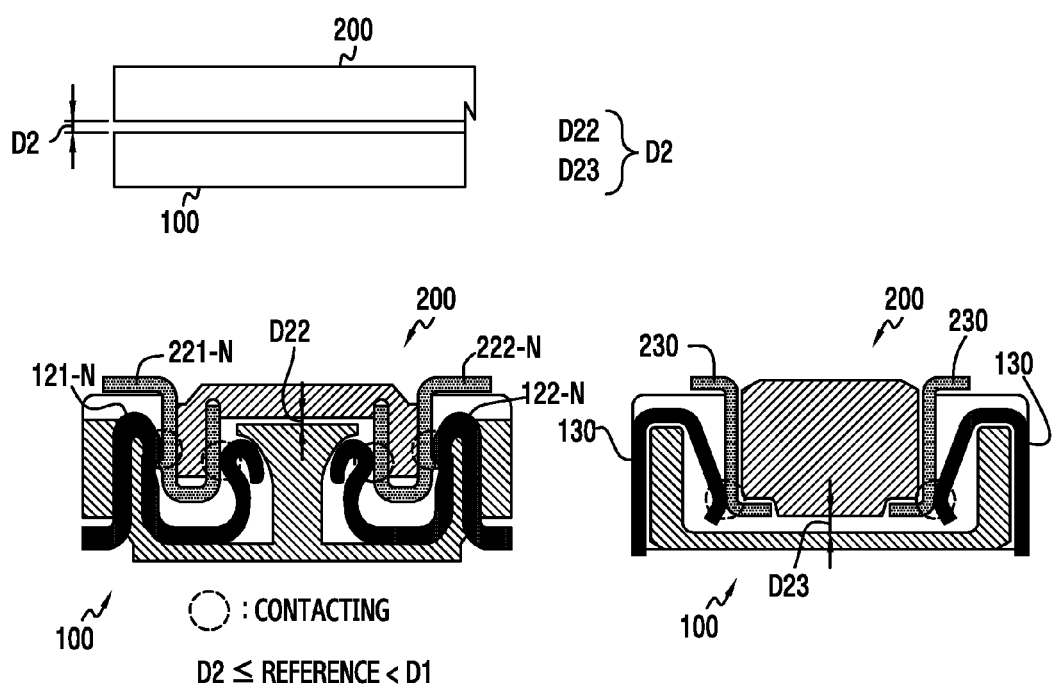
FIG. 10 illustrates a connection between a socket connector and a header connector according to an embodiment of the present disclosure.

FIG. 10 illustrates a connection between a socket connector and a header connector according to an embodiment of the present disclosure.

Referring to FIG. 10, the socket contactor 100 and the header connector 200 are coupled, and a connection distance D2 or a connection level between the socket contactor 100 and the header connector 200 may be smaller than a reference distance or level. In this case, the first socket contacts 121-N and 122-N of the socket connector 100 may contact the first header contacts 221-N and 222-N of the header connector 200, and the at least one second socket contact 130 of the socket connector 100 may also contact the second header contact 230 of the header connector 200.

As mentioned in FIG. 7B, when the socket housing 110 and the header housing 210 is not disposed in parallel, the first socket contacts 121-N and 122-N of the socket connector 100 may contact the first header contacts 221-N and 222-N of the header connector 200 whereas the second socket contact 130 of the socket connector 100 may not contact the second header contact 230 of the header connector 200.

Figure 11:
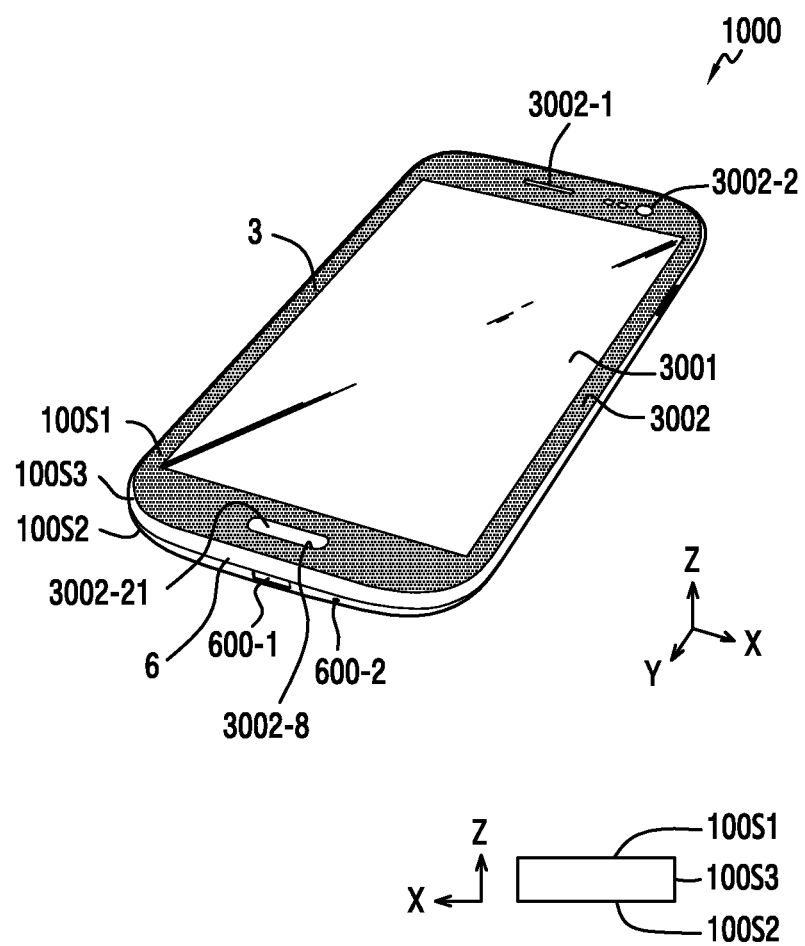
FIG. 11 illustrates an electronic device according to an embodiment of the present disclosure.

FIG. 11 illustrates an electronic device according to an embodiment of the present disclosure.

Referring to FIG. 11, an electronic device 1000 may be substantially in a rectangular plate shape. Exterior of the electronic device 1000 may include a first surface 100S1, a second surface 100S2, and a third surface 100S3. The first surface 10051 may be disposed back to back with the second surface 10052. The third surface 100S3 may interconnect the first surface 100S1 and the second surface 100S2, and enclose a space between the first surface 100S1 and the second surface 100S2.

The first surface 100S1 may be, but not limited to, flat as shown in FIG. 11, or curved. For example, the first surface 100S1 may include a convex or concave surface. The second surface 100S2 may be flat or curved. When the second surface 100S2 is curved, the electronic device 1000 may roll using the curved surface.

The electronic device 1000 may include a display set 3 and a case 6. The display set 3 provides a screen 3001 and may include, for example, a liquid crystal display (LCD) or active-matrix organic light emitting diode (AM-OLED) display. The screen 3001 may be exposed through the first surface 100S1.

The display set 3 may include a touch detector (e.g., a touch panel or a digitizer panel). For example, when a finger or a digital pen touches the screen 3001, the display set 3 may transmit a touch input signal to a processor (not shown) of the electronic device 1000. Alternatively, even when the finger or the digital pen is away from the screen 3001, the display set 3 may transmit a hovering input signal to the processor of the electronic device 1000.

The display set 3 may provide a display surface (i.e., the screen) 3001 and a non-display surface 3002. The display surface 3001 may display an image with the support of the display. The display surface 3001 may receive a touch input or a hovering input with the support of the touch panel. The non-display surface 3002 may be separated from the display surface 3001 and enclose the display surface 3001. The non-display surface 3002 may be configured to represent with a color (e.g., a black color) to be distinguished from the display surface 3001.

The non-display surface 3002 may provide a through hole 3002-1 for supporting a speaker installed in the electronic device 1000. The non-display surface 3002 may provide a transparent portion 3002-2 for an optical part (e.g., a light sensor, a camera, and the like).

The non-display surface 3002 may provide a button through hole 3002-8 for supporting a button 3002-21. The button 3002-21 may be exposed through the button through hole 3002-8 of the non-display surface 3002.

The case 6 may be coupled with the display set 3 and form at least part of the exterior of the electronic device 1000. The case 6 may include a through hole 600-1 for supporting a socket (e.g., a universal serial bus (USB) socket, a charging jack, a communication jack, and the like) installed in the electronic device 1000. The electronic device 1000 may support to detect a connection failure between the socket and a plug (not shown) of an external electronic device.

The case 6 may include a through hole 600-2 for supporting a microphone installed in the electronic device 1000.

Those ordinarily skilled in the art shall understand that the electronic device 1000 may omit some component, or replace with or add another component according to its type.

Figure 12:
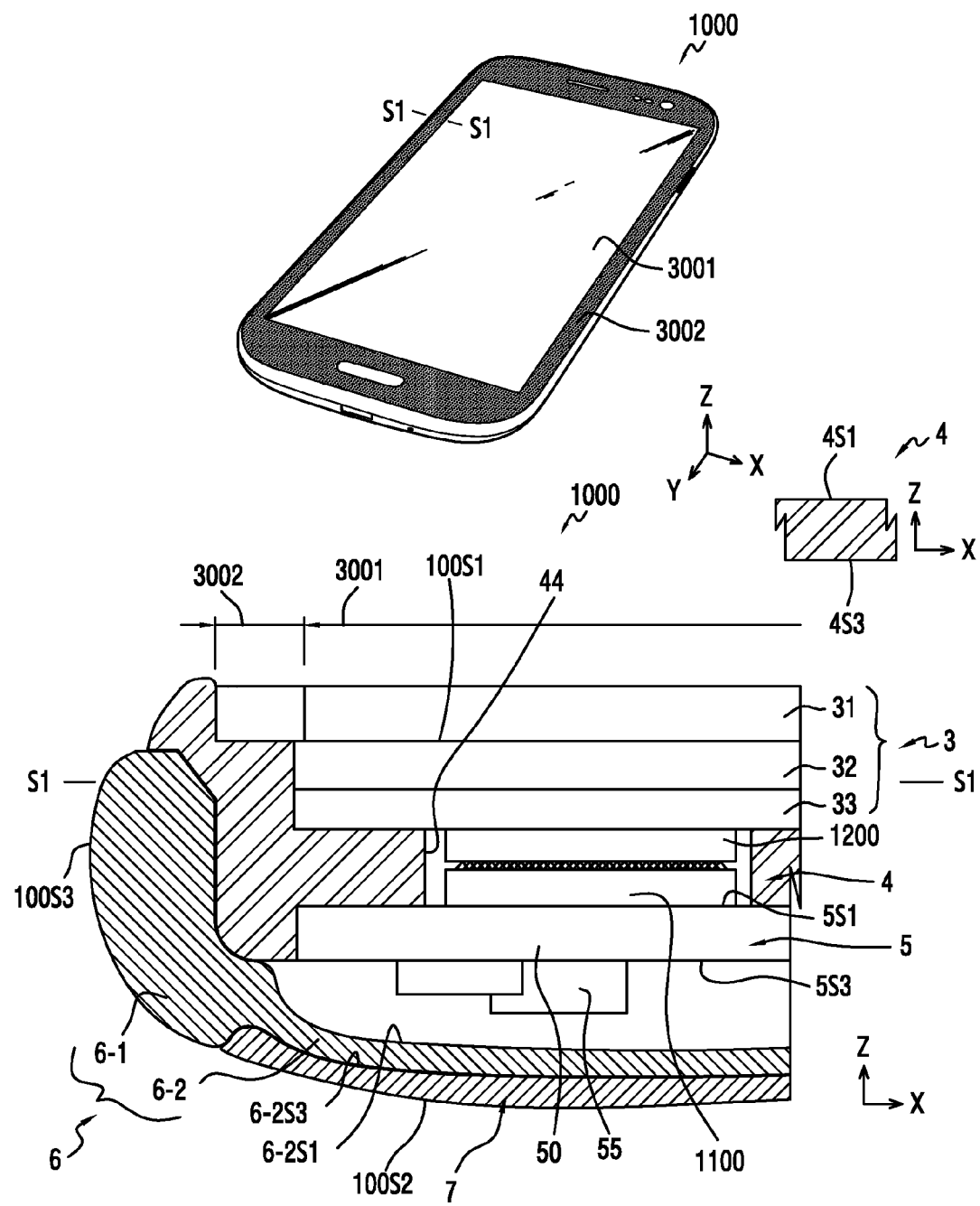
FIG. 12 is a sectional view of an electronic device according to an embodiment of the present disclosure.

FIG. 12 is a sectional view of an electronic device according to an embodiment of the present disclosure. Herein, part of the electronic device 1000 is depicted and such a structure may not be applied to the whole electronic device 1000.

Referring to FIG. 12, the electronic device 1000 may include a display set 3, a bracket 4, a main circuit board 5, a case 6, and a cover 7.

The display set 3 may include a window 31, a display 32, and a display circuit board 33.

The window 31 may form at least part of the first surface 100S1 (FIG. 11) of the electronic device 1000. The window 31 may be in a substantially plate shape. The window 31 may include a plastic or a glass with impact resistance. The window 31 may include a transparent region corresponding to the display surface 3001 and an opaque region corresponding to the non-display surface 3002.

The display 32 may be disposed between the window 31 and the display circuit board 33, and show an image through the transparent region of the window 31. The display 32 may be in a substantially plate shape. Alternatively, although not depicted, the display 32 may be flexible and curved. In this case, the window 31 may be curved as well.

The display circuit board 33 may be disposed between the display 32 and the main circuit board 5 and control image output through the display 32.

The display set 3 may further include a touch panel disposed between the window 31 and the display 32. Alternatively, the display set 3 may further include a digitizer panel interposed between the display 32 and the display circuit board 33. The touch panel or the digitizer panel may support the touch input or the hovering input through the display surface 3001 of the display set 3.

The bracket 4 may be in a substantially plate shape for mounting the display set 3 and the main circuit board 5. The bracket 4 may include one side 4S1 and the other side 4S3 which stand back to back and mount electronic parts. The bracket 4 is disposed near the display set 3 and the main circuit board 5, the one side 4S1 of the bracket 4 may be configured for the mounting of the display set 3, and the other side 4S3 of the bracket 4 may be configured for the mounting of the main circuit board 5. The one side 4S 1 and the other side 4S3 of the bracket 4 may be formed in a groove shape for receiving the display set 3 and the main circuit board 5, respectively. Accordingly, the display set 3 and the main circuit board 5 may be fitted into the bracket 4 without any spacing.

The bracket 4 may include a through hole 44. The through hole 44 may be a path for interlinking a connector 1200 of the display set 3 and a connector 1100 of the main circuit board 5. The through hole 44 may employ various shapes, such as a square, a triangle, a circle, and the like, according to the connection type between the connectors 1100 and 1200.

The bracket 4 may give stiffness to the display set 3 and the circuit board 5. The bracket 4 may shield electromagnetic waves and block an electric noise or serve as a heat radiating plate to prevent the electronic part from heating. The bracket 4 may be formed of, but not limited to, a metal, such as magnesium (Mg) or Aluminum (Al) or a nonmetal, such as plastic. In addition, a material for shielding the electromagnetic waves may be spread on the bracket 4.

The main circuit board 5 (e.g., a main board, a mother board, a printed board assembly (PBA), a printed circuit board (PCB), and the like) includes a plurality of electronic parts 55 mounted on one side 5S1 and/or the other side 5S3 and an electric circuit 50 for interconnecting them. The main circuit board 5 may configure an execution environment of the electronic device 1000, retain such information, and support data input/output exchange of devices in the electronic device 1000. The main circuit board 5 already coupled to the bracket 4 may be mounted.

The one side 5S1 of the main circuit board 5 may meet at least part of the other side 4S3 of the bracket 4, and the other side 4S3 of the bracket 4 may provide a space (not shown) for receiving electronic parts (not shown) mounted on the one side 5S1 of the main circuit board 5. A space may be created between the other side 5S3 of the main circuit board 5 and the case 6, and accommodate the electronic parts 55 mounted on the other side 5S3 of the main circuit board 5.

The case 6 may be shaped substantially like a receptacle with an open upper side, and be coupled with the bracket 4 to create the whole frame of the electronic device 1000. The electronic parts (e.g., the display set 3 and the main circuit board 5) may be mounted in a frame structure including the case 6 and the bracket 4 inside the electronic device 1000. The case 6 may include a first portion 6-1 for forming the third surface 100S3 of the electronic device 1000, and a second portion 6-2 extending from the first portion 6-1 and disposed below the bracket 4. Since the first portion 6-1 is shaped to be coupled with the bracket 4, edges of the bracket 4 may be fitted into the first portion 6-1 and the bracket 4 may be mounted on the case 6 without any spacing. The second portion 6-2 is shaped to cover the one side 4S3 of the bracket 4, and its inside 6-2S1 may be, but not limited to, smooth or may be uneven. For example, the inside 6-2S1 of the second portion 6-2 may include at least one rib (not shown) extending to the bracket 4 and supporting the bracket 4. The inside 6-2S1 of the second portion 6-2 may include at least one rib (not shown) extending to the main board 5 and supporting the main board 5. The outside 6-2S3 of the second portion 6-2 may include a space in which the cover is fitted.

The second portion 6-2 of the case 6 may include a through hole (not shown), and some (e.g., a memory socket) of the electronic parts 55 of the main circuit board 5 may be inserted to the through hole of the second portion 6-2. When the cover 7 covers the second portion 6-2 of the case 6, the electronic part (e.g., a battery pack, a memory card, and the like) of the main circuit board 5 in the through hole of the second portion 6-2 may be hidden. Alternatively, when the cover 7 is detached from the case 6, the electronic part of the main circuit board 5 in the through hole of the second portion 6-2 may be exposed.

The case 6 may include a conductive material and may apply an electric current to a ground plane of the main circuit board 5. For example, a conductive material may be spread on the inside 6-2S1 of the second portion 6-2 of the case 6. The electric current may flow between the conductive material of the case 6 and the ground plane of the main circuit board 5 by contacting the rib of the second portion 6-2 to the ground plane of the main circuit board 5. Herein, the rib of the second portion 6-2 may include a conductive rubber gasket for elastically contacting the ground plane of the main circuit board 5.

The cover 7 may be coupled with the second portion 6-2 of the case 6 and form the second surface 100S2 of the electronic device 1000.

The cover 7 may be curved, and the second surface 100S2 of the electronic device 1000 may be curved. The second portion 6-2 of the case 6 is in a groove shape for receiving the cover 7. Hence, the cover 7 may be fitted into the second portion 6-2 of the case 6 without any spacing. The cover 7 may be coupled to the second portion 6-2 of the case 6 using snap-fits and detached from the second portion 6-2 of the case 6.

To detach the electronic part (e.g., a memory card or a battery pack), the cover 7 may be separated from the case 6.

Figure 13:
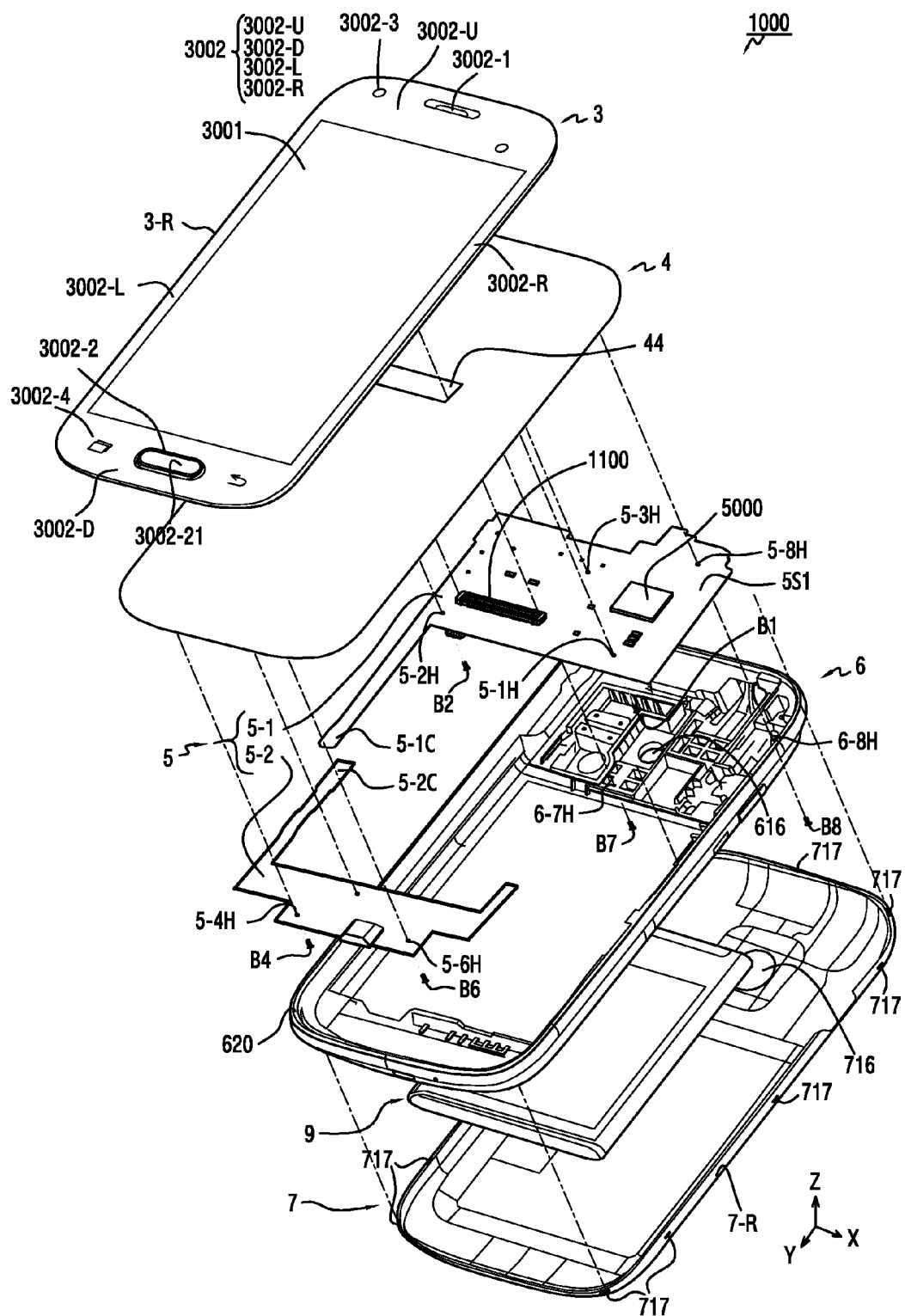
FIG. 13 is an exploded view of an electronic device according to an embodiment of the present disclosure.

FIG. 13 is an exploded view of an electronic device according to an embodiment of the present disclosure.

Referring to FIG. 13, the electronic device 1000 may include a display set 3, a bracket 4, a main circuit board 5, a case 6, a battery pack 9, and a cover 7.

The display set 3 may be substantially rectangular. The display set 3 may include a display region 3001 and a non-display region 3002. The display region 3001 (e.g., the display surface of FIG. 12) may correspond to a screen of the display 32 of FIG. 12. The display region 3001 may be rectangular with two long sides in a y-axis direction. The non-display region 3002 (e.g., the non-display surface of FIG. 12) may be in a rectangular ring shape enclosing the display region 3001. For example, the non-display region 3002 may include an upper edge region 3002-U, a lower edge region 3002-D, a left edge region 3002-L, and a right edge region 3002-R. The upper edge region 3002-U and the lower edge region 3002-D may face each other. The left edge region 3002-L and the right edge region 3002-R may face each other. The upper edge region 3002-U or the lower edge region 3002-D may be relatively wider than the left edge region 3002-L or the right edge region 3002-R. The non-display region 3002 may be colored black. Alternatively, the non-display region 3002 may represent a metallic texture.

The display set 3 may include a receiver hole 3002-1 disposed in the non-display region 3002 (e.g., the upper edge region 3002-U). The receiver hole 3002-1 is positioned to correspond to a receiver (not shown) of the main circuit board 5 or the case 6, and may emit a sound output from the receiver to the outside through the receiver hole 3002-1.

The display set 3 may include a button hole 3002-2 disposed in the non-display region 3002 (e.g., the lower edge region 3002-D). The display set 3 may include a button circuit (not shown) disposed between the window 31 of FIG. 12 and the bracket 4. The button 3002-21 of the button circuit may be disposed in the one side 100S1 (FIG. 11) of the electronic device 1000 through the button hole 3002-2.

The display set 3 may further include a transparent region 3002-3 in the non-display region 3002. The transparent region 3002-3 may be positioned to correspond to a sensor (e.g., a light sensor or an image sensor) of the main circuit board 5.

The display set 3 may further include a touch key marker 3002-4 in the non-display region 3002. The touch key marker 3002-4 may be disposed on both sides of the button hole 3002-2. The display set 3 may include a touch key circuit (not shown) disposed between the window 31 and the bracket 4. The touch key circuit may be positioned to correspond to the touch key maker 3002-4.

The display set 3 may include a connector (e.g., the header connector 200 of FIG. 4) which is not shown. The connector may be used to electrically connect the display 32 (FIG. 12) of the display set 3 and/or a touch input device (e.g., a touch panel or a digitizer panel) and the main circuit board 5. Alternatively, the connector may be used to electrically connect the button circuit (not shown) of the display set 3 or the touch key circuit and the main circuit board 5.

The display set 3 may be coupled with the case 6. For example, a ring-shaped edge 3-R of the display 3 may be mounted in a ring-shaped edge of an opening portion 620. When the display set 3 and the case 6 are coupled with each other, a space for receiving the bracket 4 and the main circuit board 5 may be formed.

The bracket 4 may be disposed between the display set 3 and the main circuit board 5. The bracket 4 may include a through hole 44 for electrically connecting the display set 3 and the main circuit board 5.

The main circuit board 5 may be disposed between the bracket 4 and the case 6.

The main circuit board 5 may include a plurality of circuit boards 5-1 and 5-2 which may be separated from each other. For example, the main circuit board 5 may include the first circuit board 5-1 and the second circuit board 5-2 disposed on both sides of the electronic device 1000. The first circuit board 5-1 may include a first connector 5-1C relatively protruding and extending. The second circuit board 5-2 may also include a second connector 5-2C relatively protruding and extending. The first connector 5-1C and the second connector 5-2C are coupled, and the first circuit board 5-1 and the second circuit board 5-2 may be electrically connected.

The main circuit board 5 may include a connector 1100 (e.g., the socket connector 100 of FIG. 1) on the one side 5S1. The connector 1100 may be connected to a connector (not shown) (e.g., the header connector 200 of FIG. 4) of the display set 3 through the through hole 44 of the bracket 4.

The main circuit board 5 may include a processor 5000 (e.g., an application processor (AP)). The processor 5000 may detect no electric current flow of at least one of joints between the connector of the display set 3 and the connector 1100 of the main circuit board 5, and notify an incomplete connection or a connection failure between the connector of the display set 3 and the connector 1100 of the main circuit board 5 using an image through the display 32 or using a sound through a speaker.

The incomplete connection between the connector 1200 (FIG. 12) of the display set 3 and the connector 1100 of the main circuit board 5 may arise when the connectors 1100 and 1200 are not completely connected while the display set 3, the bracket 4, the main circuit board 5, and the case 6 are assembled. Alternatively, the incomplete connection between the connector 1200 (FIG. 12) of the display set 3 and the connector 1100 of the main circuit board 5 may be caused by a wrong connection between the display set 3 and the bracket 4 and/or a wrong connection between the bracket 4 and the main circuit board 5.

The incomplete connection between the connector 1200 (FIG. 12) of the display set 3 and the connector 1100 of the main circuit board 5 may result in an unstable contact between the contacts. For example, when an impact is exerted on the electronic device 1000, the contacts may be easily disconnected. Such an incomplete connection between the connector 1200 of the display set 3 and the connector 1100 of the main circuit board 5 may cause a malfunction (e.g., screen off) of the electronic device 1000. By contrast, the complete connection between the connector 1200 of the display set 3 and the connector 1100 of the main circuit board 5 may stabilize the connection between the contacts. Naturally, as the connection between the connector 1200 of the display set 3 and the connector 1100 of the main circuit board 5 is maintained, it is less likely that the electronic device 1000 malfunctions. As such, the processor 5000 may detect and warn of the incomplete connection between the connectors 1100 and 1200. In response to the warning, those skilled in the art may retry the complete connection between the connectors 1100 and 1200. Hence, the incomplete connection between the connectors 1100 and 1200 may be detected in advance, and a product error rate of the electronic device 1000 may be reduced.

The main circuit board 5 may include a plurality of bolt holes 5-1H through 5-8H. The bolt holes 5-1H through 5-8H may be disposed to correspond to a plurality of bosses (not shown) of the bracket 4.

A plurality of bolts B1, B2, B4 and B6 penetrates through the bolt holes 5-1H, 5-2H, 5-4H and 5-6H of the main circuit board 5 and engages with the bosses of the bracket 4. Hence, the main circuit board 5 and the bracket 4 may be assembled.

The case 6 may include a plurality of bolt holes 6-7H and 6-8H. The bolt holes 6-7H and 6-8H may be positioned to correspond to the bolt holes 5-7H and 5-8H of the main circuit board 5. A plurality of bolts B7 and B8 penetrates the bolt holes 6-7H and 6-8H of the case 6 and the bolt holes 5-7H and 5-8H of the main circuit board 5 and engage with a plurality of bosses of the bracket 4. Thus, the case 6, the main circuit board 5, and the bracket 4 may be united together. The display set 3 may be assembled with the case 6, the main circuit board 5, and the bracket 4. As mentioned earlier, the processor 5000 may detect and warn of the incomplete connection between the connectors 1100 and 1200. In response to the warning, those skilled in the art may retry the reconnection of the display set 3 for the sake of the complete connection between the connectors 1100 and 1200.

The case 6 may include an opening portion 620 for mounting the bracket 4. The main circuit board 5 may be disposed in a space formed by assembling the case 6 and the bracket 4.

The case 6 may include a conductive material, and may reduce an electric noise of the electronic device 1000 or spread the heat from a heating part (e.g., the main circuit board 5).

The case 6 may include a transparent window 616. For example, the transparent window 616 may be positioned to correspond to an optical electronic part (e.g., a camera module) disposed in the other side 5S3 (FIG. 12) of the main circuit board 5.

The battery pack 9 may be mounted in a battery pack mounting portion (not shown) in the one side 6-2S3 (FIG. 12) of the case 6.

The cover 7 may be mounted below the case 6. The cover 7 may include a through hole 716 and a plurality of hooks 717. The through hole 716 may be positioned to correspond to the transparent window 616 of the case 6. The hooks 717 may be arranged at edges 7-R. The hooks 717 are coupled with a plurality of grooves (not shown) of the case 6, and thus the cover 7 may be coupled with the case 6.

The cover 7 may include a conductive material. The conductive material may reduce an electric noise of the electronic device 1000. Alternatively, the conductive material may spread the heat from the heating part (e.g., the main circuit board 5).

The electronic device 1000 may further include a circuit device including an antenna or a speaker (not shown) disposed between the second circuit board 5-2 and the case 6. For example, a terminal (e.g., an elastic terminal) of the circuit device may electrically contact a terminal (not shown) in one side of the second circuit board 5-2. The circuit device may include the antenna or the speaker in a plastic injection-molded part.

Figure 14:
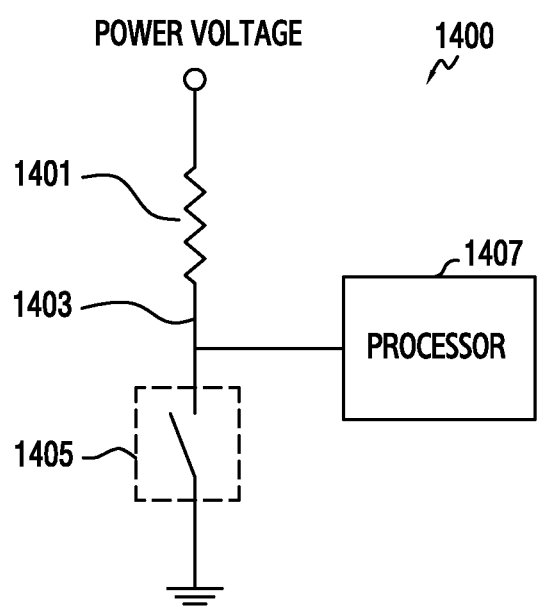
FIG. 14 illustrates a circuit for detecting a connection state between a first connector and a second connector according to an embodiment of the present disclosure.

FIG. 14 illustrates a circuit for detecting a connection state between a first connector and a second connector according to an embodiment of the present disclosure.

Referring to FIG. 14, a circuit 1400, which is a circuit for pull-up, may include a pull-up resistor 1401, a connection line 1403, a switch 1405, and a processor 1407.

The pull-up resistor 1401 may be connected to a power voltage.

One end of the connection line 1403 may be connected to the pull-up resistor 1401, and the other end thereof may be connected to a ground.

The switch 1405 is connected to the connection line 1403. As the switch 1405 is opened or closed, the connection line 1403 may be disconnected or connected.

The processor 1407 (e.g., the processor 5000 of FIG. 13) may be electronically connected to part of the connection line 1403. When the switch 1405 is open, the connection line 1403 is disconnected and a high signal is output to the processor 1407. In response to the high signal, the processor 1407 may detect the incomplete connection between a first connector (e.g., the socket connector 100 of FIG. 1) and a second connector (e.g., a header connector 200 of FIG. 4). Alternatively, when the switch 1405 is closed, the connection line 1403 is connected and a low signal is output to the processor 1407. In response to the low signal, the processor 1407 may detect the complete connection between the first connector and the second connector.

The switch 1405 may be opened when the electric current does not flow between at least one preset contact of the first connector (e.g., the socket connector 100 of FIG. 1) and a preset contact of the second connector (e.g., a header connector 200 of FIG. 4). Alternatively, the switch 1405 may be closed when the electric current flows between at least one preset contact of the first connector and a preset contact of the second connector.

Figure 15:
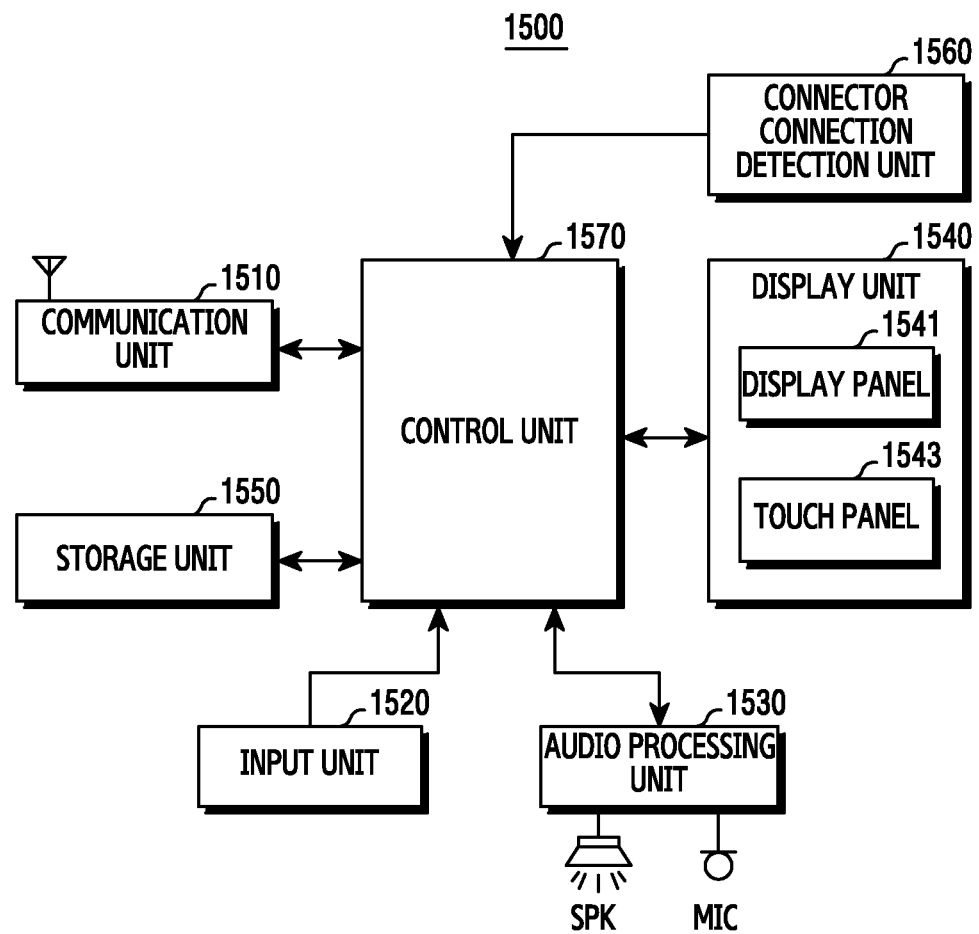
FIG. 15 illustrates an electronic device according to an embodiment of the present disclosure.

FIG. 15 illustrates a simplified block diagram of an electronic device according to an embodiment of the present disclosure.

Referring to FIG. 15, an electronic device 1500 may include a communication unit 1510, an input unit 1520, an audio processing unit 1530, a display unit 1540, a storage unit 1550, a connector connection detection unit 1560, and a control unit 1570.

The electronic device 1500 may detect the connector connection between two devices and support a corresponding function. For example, the electronic device 1500 may detect the connector connection between two devices therein. Alternatively, the electronic device 1500 may detect the connector connection between the electronic device 1500 and another electronic device. Herein, in response to the incomplete connector connection, the electronic device 1500 may display an image corresponding to the incomplete connector connection through a screen or output a sound (e.g., beep sound) corresponding to the incomplete connector connection through a speaker.

The communication unit 1510 supports a communication function of the electronic device 1500. The communication unit 1510 may be added when the electronic device 1500 is manufactured to support the communication function. Accordingly, when the electronic device 1500 does not support the communication function, the communication unit 1510 may be omitted. To support the communication function, particularly, a mobile communication function of the electronic device 1500, the communication unit 1510 may include a mobile communication module. The communication unit 1510 establishes a communication channel with a mobile communication system and supports signal delivery for the mobile communication function of the electronic device 1500. For example, the communication unit 1510 may establish at least one of a voice service channel, a video service channel, and a data service channel with the mobile communication system and support particular signal delivery over the corresponding service channel.

At least one component of the communication unit 1510 may be mounted in the electronic device 1500 using a connector (e.g., the socket connector 100 of FIG. 1 or the header connector 200 of FIG. 4).

The input unit 1520 generates various input signals for operating the electronic device 1500. The input unit 1520 may include various input devices, such as a keyboard, a keypad, a key button, and the like, according to compatibility of the electronic device 1500. When the display unit 1540 includes a touch screen, the input unit 1520 may be configured as a touch map output on the touch screen.

At least one component of the input unit 1520 may be mounted in the electronic device 1500 using a connector (e.g., the socket connector 100 of FIG. 1 or the header connector 200 of FIG. 4).

The audio processing unit 1530 may output various audio data for the operations of the electronic device 1500, audio data according to audio file play stored in the storage unit 1550, and audio data received from the outside. The audio processing unit 1530 may support an audio data collection function. For doing so, the audio processing unit 1530 may include a speaker (SPK) and a microphone (MIC). More particularly, the audio processing unit 1530 may output various sound effects or notification sounds relating to multi-touch input processing under control of a user or the control unit 1570. When the connectors between two devices are incompletely connected or disconnected, the corresponding signal may be fed to the audio processing unit 1530 and the audio processing unit 1530 may support outputting a corresponding notification sound or warning sound.

At least one component of the audio processing unit 1530 may be mounted in the electronic device 1500 using a connector (e.g., the socket connector 100 of FIG. 1 or the header connector 200 of FIG. 4).

The display unit 1540 provides various screen interfaces for the operations of the electronic device 1500. When the connector is incompletely connected or disconnected, the corresponding signal may be fed to the display unit 1540 and the display unit 1540 may support outputting a corresponding image.

The display unit 1540 may include a touch screen by combining a display panel 1541 and a touch panel 1543. The display panel 1541 may output images and texts corresponding to the various screens, and output at least one of the aforementioned screen interfaces. The touch panel 1543 may include a touch valid region for normally collecting a touch input and a touch invalid region for discarding the collected touch input or collecting no touch input according to screen characteristics output on the display panel 1541, and forward the touch input of the touch valid region to the control unit 1570.

At least one component of the display unit 1540 may be mounted in the electronic device 1500 using a connector (e.g., the socket connector 100 of FIG. 1 or the header connector 200 of FIG. 4).

The storage unit 1550 may store various default operating systems for operating the electronic device 1500, data, application programs, and algorithms corresponding to various user functions.

The storage unit 1550 may store a program for detecting the connector connection failure between two devices.

At least one component of the storage unit 1550 may be mounted in the electronic device 1500 using a connector (e.g., the socket connector 100 of FIG. 1 or the header connector 200 of FIG. 4).

The connector connection detection unit 1560 may detect the connector connection between a first device and a second device, and transmit a corresponding signal to the control unit 1570. Herein, both of the first device and the second device may be installed in the electronic device 1500. Alternatively, the first device may be installed in the electronic device 1500 and the second device may be installed in an external electronic device. The signal corresponding to the connector connection between the first device and the second device may further include information for identifying the first device and the second device.

For example, the connector connection detection unit 1560 may detect no electric current flow of at least one of joints between a first connector (e.g., the socket connector 100 of FIG. 1) of the first device and a second connector (e.g., the header connector 200 of FIG. 4) of the second device, and transmit to the control unit 1570 the signal corresponding to the incomplete connector connection between the first connector of the first device and the second connector of the second device.

The connector connection detection unit 1560 may detect the connector connection between two devices installed in one or more portions of the electronic device 1500, and transmit a corresponding signal to the control unit 1570. For example, the connector connection detection unit 1560 may detect the incomplete connector connection between the main circuit board 5 and the display set 3. Besides, the connector connection detection unit 1560 may detect the incomplete connector connection between various components in the electronic device 1500.

The connector connection detection unit 1560 may detect the connector connection between the electronic device 1500 and various external electronic devices, and transmit a corresponding signal to the control unit 1570. Herein, the external electronic devices may include a device including a display, a device (e.g., an earset) including a speaker, a device including a microphone, a device allowing wired/wireless communication, and a charging device.

The connector connection detection unit 1560 may be included in the control unit 1570.

The control unit 1570 (e.g., the processor 1407 of FIG. 14) controls various signal flows, the information collection, and the outputting in order to support the multi-touch input processing.

According to an embodiment of the present disclosure, the control unit 1570 may receive the signal corresponding to the incomplete connector connection between two devices, from the connector connection detection unit 1560. In response to the received signal, the control unit 1570 may support outputting an image corresponding to the incomplete connector connection between two devices through the display unit 1570, or outputting a sound corresponding to the incomplete connector connection between two devices through the speaker.

According to another embodiment of the present disclosure, when an external display device is additionally connected to the electronic device 1500, the control unit 1570 may support outputting an image corresponding to the incomplete connector connection between two devices through the external display device.

According to yet another embodiment of the present disclosure, when an external speaker device is additionally connected to the electronic device 1500, the control unit 1570 may support outputting a sound corresponding to the incomplete connector connection between two devices through the external speaker device.

According to various embodiments of the present disclosure, the electronic device 1500 may further include various additional modules according to its type. For example, the electronic device 1500 may further include a short-range communication module for short-range communication, an interface for transmitting and receiving data using the wired communication or wireless communication of the electronic device 1500, an Internet communication module for an Internet communication function over Internet, a digital broadcasting module for receiving and reproducing digital broadcasts, and other components. Since the structural elements may be variously changed according to a trend toward convergence of digital devices, the electronic device 1500 may further include structural elements equivalent to the foregoing structural elements. In addition, a person of ordinary skill in the art should appreciate that a specific element may be omitted or replaced by another element in the above configuration according to the form in which the electronic device 1500 is provided. The above should be easily appreciated by a person of ordinary skill in the art.

According to various embodiments of the present disclosure, the electronic device 1500 may include all mobile communication terminals which operate based on communication protocols corresponding to various communication systems as well as all information technology devices, multimedia devices and their associated application devices, such as a PMP, a digital broadcasting player, a PDA, a music reproducing device (e.g., an MP3 player), a mobile game terminal, a smart phone, a notebook, and a handheld PC.

Figure 16:
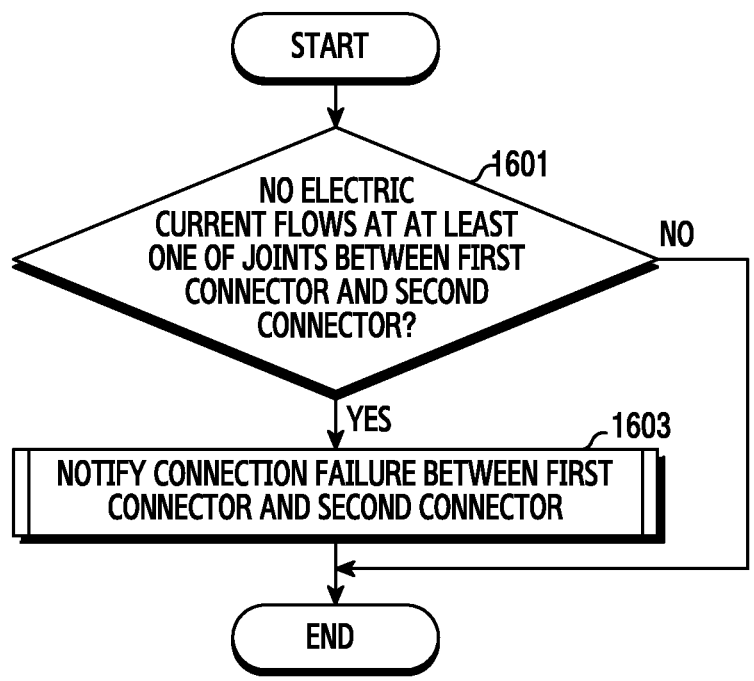
FIG. 16 illustrates a flowchart of a method for notifying a connector connection failure according to an embodiment of the present disclosure.

FIG. 16 illustrates a flowchart of a method for notifying a connector connection failure according to an embodiment of the present disclosure.

Referring to FIG. 16, when no electric current flows at least one of joints between a first connector and a second connector, the connector connection detection unit 1560 may detect the disconnection in operation 1601. Herein, the connector connection detection unit 1560 may detect the disconnection of at least one of the joints.

According to an embodiment of the present disclosure, when the second connector of the electronic device 1500 is incompletely connected to the first connector of the electronic device 1500, part of the contact of the first connector may not contact the corresponding contact of the second connector and the connector connection detection unit 1560 may detect the disconnection.

According to another embodiment of the present disclosure, when the second connector of an external device is incompletely connected to the first connector of the electronic device 1500, some contact of the first connector does not contact the corresponding contact of the second connector and the connector connection detection unit 1560 may detect the disconnection.

In response to the detected disconnection of at least one of the joints between the first connector and the second connector, the control unit 1570 may notify the connection failure between the first connector and the second connector in operation 1603. For example, the control unit 1570 may support outputting the connector connection failure using an image or a sound.

Figure 17:
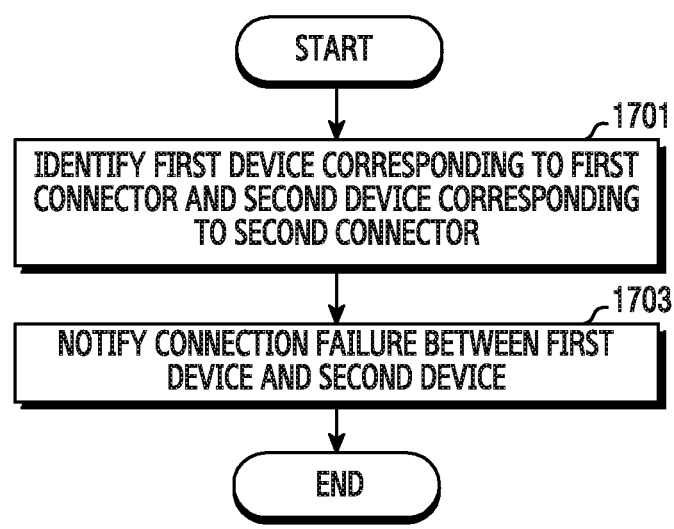
FIG. 17 illustrates a flowchart of a method for notifying a connector connection failure between a first connector and a second connector according to an embodiment of the present disclosure.
Figure 18:
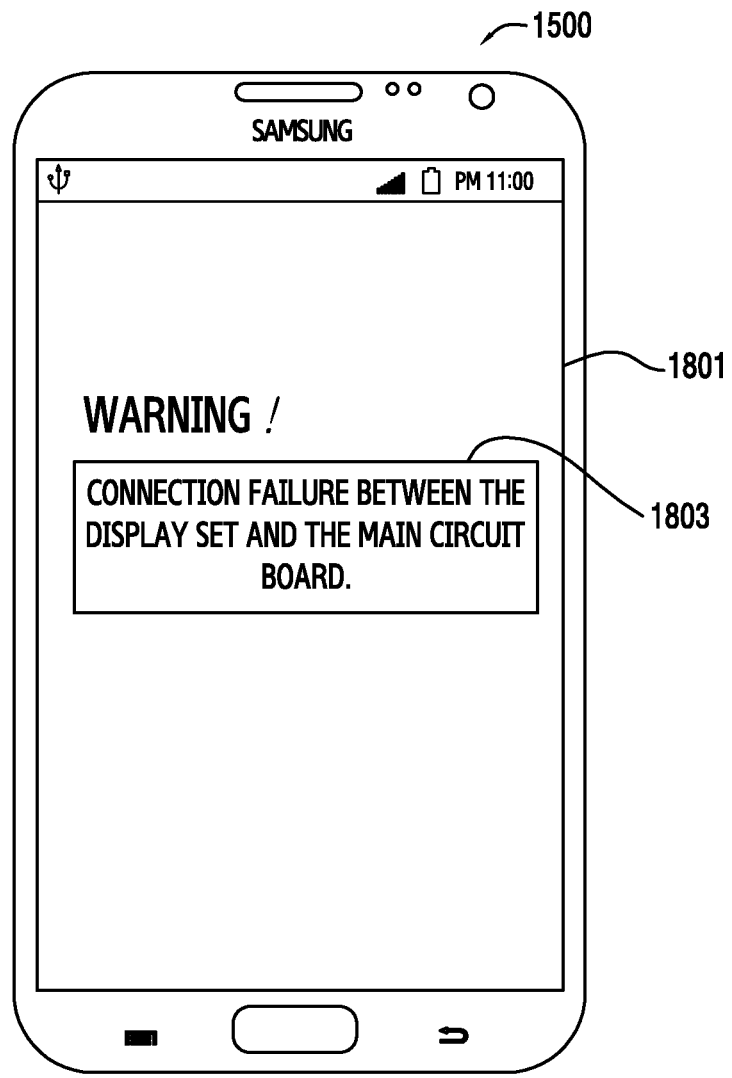
FIGS. 18 and 19 illustrate connector connection failure notification according to an embodiment of the present disclosure.
Figure 19:
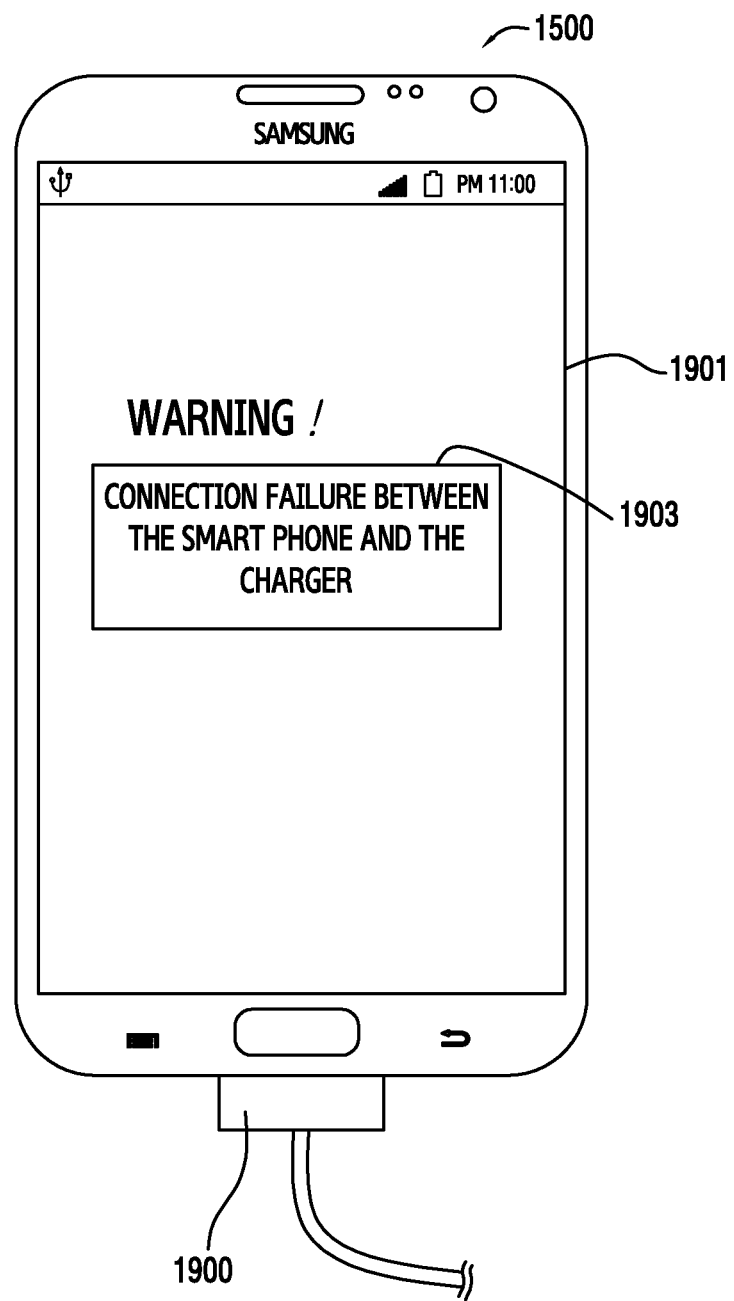

FIG. 17 illustrates a flowchart of a method for notifying a connector connection failure between a first connector and a second connector according to an embodiment of the present disclosure. FIGS. 18 and 19 illustrate connector connection failure notification according to an embodiment of the present disclosure.

Referring to FIG. 17, in operation 1701, the control unit 1570 may identify a first device corresponding to the first connector and a second device corresponding to the second connector of the electronic device 1500. According to an embodiment of the present disclosure, the control unit 1570 may identify the first device (e.g., the display set 3) corresponding to the first connector of the electronic device 1500 and the second device (e.g., the main circuit board 5) corresponding to the second connector of the electronic device 1500. According to another embodiment of the present disclosure, the control unit 1570 may identify the electronic device 1500 corresponding to the first connector and an external electronic device (e.g., a charger) corresponding to the second connector. Herein, the control unit 1570 may obtain information for identifying the external electronic device through a particular joint connected between the first connector and the second connector.

In operation 1703, the control unit 1570 may notify the connection failure between the first device and the second device. For example, the control unit 1570 may support displaying a message 1803 notifying the connection failure using the connector of two devices of the electronic device 1500, through the screen 1801. For example, the control unit 1570 may support displaying a message 1903 notifying the connection failure using the connector between the electronic device 1500 and the external electronic device (e.g., the charger) through the screen 1901.

The control unit 1570 may support outputting a sound notifying the connection failure using the connector of two devices of the electronic device 1500, through the speaker of the electronic device 1500. For example, in response to the connector connection failure between the display set 3 and the main circuit board 5, the control unit 1570 may support outputting a sound "Connection failure between the display set and the main circuit board. Please reconnect the connector.".

The control unit 1570 may notify the connection failure using the connector of two devices by outputting a beep sound through the speaker of the electronic device 1500. Herein, the control unit 1570 may support outputting the beep sound for identifying two devices. For example, a continuous beep sound may indicate the connection failure using the connector between the display set 3 and the main circuit board 5. Alternatively, three beep sounds may indicate the connection failure using the connector between the electronic device 1500 and the external electronic device.

Figure 20:
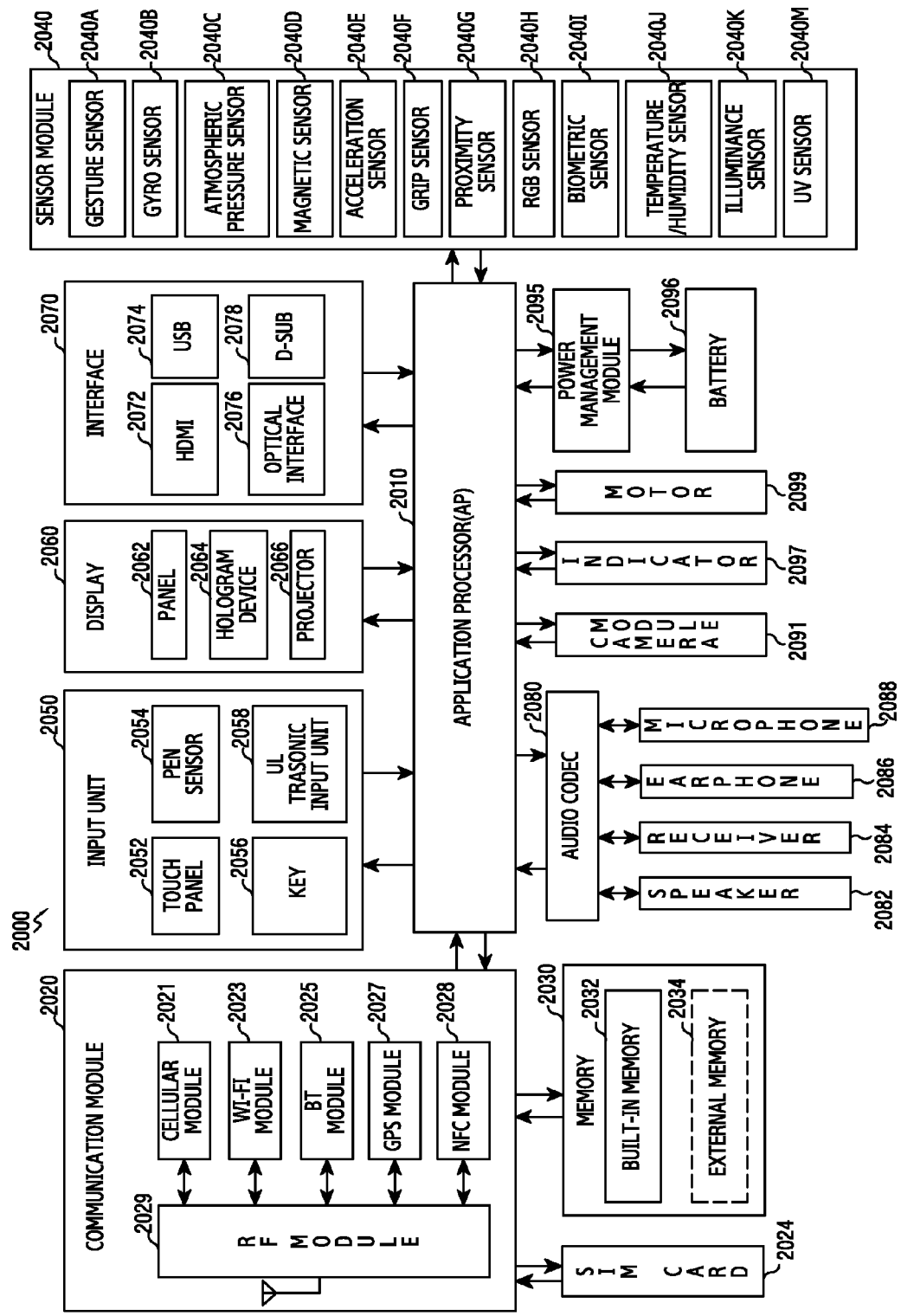
FIG. 20 illustrates a block diagram of an electronic device according to an embodiment of the present disclosure.

FIG. 20 illustrates a block diagram of an electronic device according to an embodiment of the present disclosure.

Referring to FIG. 20, an electronic device 2000, for example, may include all or part of the above-mentioned electronic device 1500 of FIG. 15. Referring to FIG. 20, the electronic device 2000 may include one or more APs 2010 (e.g., the processor 5000 of FIG. 13), a communication module 2020, a Subscriber Identification Module (SIM) card 2024, a memory 2030, a sensor module 2040, an input device 2050, a display 2060, an interface 2070, an audio module 2080, a camera module 2091, a power management module 2095, a battery 2096, an indicator 2097, and a motor 2098.

The AP 2010 may control a plurality of hardware or software components connected to the AP 2010 and also perform various data processing and operations by executing an operating system or an application program. The AP 2010 may be implemented with a system on chip (SoC), for example. The AP 2010 may further include a graphic processing unit (GPU).

The communication module 2020 may transmit and receive data to and from other electronic devices connected with the electronic device 2000 over a network. The communication module 2020 may include a cellular module 2021, a wireless fidelity (WiFi) module 2023, a Bluetooth (BT) module 2025, a GPS module 2027, a near field communication (NFC) module 2028, and a radio frequency (RF) module 2029.

The cellular module 2021 may provide a voice call, a video call, a short message service (SMS), or an internet service through a communication network (e.g., long term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM)). The cellular module 2021 may, for example, identify and authenticate the electronic device in a communication network by using a subscriber identification module (e.g., the SIM card 2024). The cellular module 2021 may perform at least part of the functions of the AP 2010. For example, the cellular module 2021 may perform at least some of multi-media control functions.

The cellular module 2021 may further include a communication processor (CP). The cellular module 2021 may be implemented with, for example, an SoC. While the components of the cellular module 2021 (e.g., the CP), the memory 2030, and the power management module 2095 are separated from the AP 2010 in FIG. 20, the AP 2010 may include at least part (e.g., the cellular module 2021) of the above-stated components.

The AP 2010 or the cellular module 2021 (e.g., the CP) may load and process an instruction or data received from its connected non-volatile memory or at least one of the other components, in a volatile memory.

In addition, the AP 2010 or the cellular module 2021 may store data received from or generated by at least one of the other components, in the non-volatile memory.

The WiFi module 2023, the BT module 2025, the GPS module 2027, and the NFC module 2028 each may include, for example, a processor for processing the data transmitted and received via the corresponding module. While the cellular module 2021, the WiFi module 2023, the BT module 2025, the GPS module 2027, and the NFC module 2028 are separated from each other in FIG. 20, at least part (e.g., at least two) of the cellular module 2021, the WiFi module 2023, the BT module 2025, the GPS module 2027, and the NFC module 2028 may be included in a single integrated chip (IC) or an IC package. For example, at least part (e.g., the CP corresponding to the cellular module 2021 and the WiFi processor corresponding to the WiFi module 2023) of the processors corresponding to the cellular module 2021, the WiFi module 2023, the BT module 2025, the GPS module 2027, and the NFC module 2028 may be implemented using a single SoC.

The RF module 2029 may transmit and receive data, for example, RF signals. The RF module 2029 may include, for example, a transceiver, a power amp module (PAM), a frequency filter, and a low noise amplifier (LNA), which are not shown. In addition, the RF module 2029 may further include a component, for example, a conductor or a conducting wire, for transmitting and receiving electromagnetic waves in free space during the wireless communication. While the cellular module 2021, the WiFi module 2023, the BT module 2025, the GPS module 2027, and the NFC module 2028 share the single RF module 2029 in FIG. 20, at least one of the cellular module 2021, the WiFi module 2023, the BT module 2025, the GPS module 2027, and the NFC module 2028 may transmit and receive the RF signals via a separate RF module.

The SIM card 2024 may be a card including the SIM and inserted to a slot formed at a specific location of the electronic device. The SIM card 2024 may include unique identification information (e.g., integrated circuit card identifier (ICCID)) or subscriber information (e.g., international mobile subscriber identity (IMSI)).

The memory 2030 may include an internal memory 2032 or an external memory 2034. For example, the internal memory 2032 may include at least one of the volatile memory (e.g., dynamic RAM (DRAM), static RAM (SRAM), synchronous dynamic RAM (SDRAM)) and the non-volatile memory (e.g., one-time Programmable ROM (OTPROM), programmable ROM (PROM), erasable and programmable ROM (EPROM), electrically erasable and programmable ROM (EEPROM), mask ROM, flash ROM, NAND flash memory, and NOR flash memory).

The internal memory 2032 may be a solid state drive (SSD). The external memory 2034 may include a flash drive, for example, a compact flash (CF), a secure digital (SD), a micro-SD, a mini-SD, an extreme digital (xD), a memory stick, and the like. The external memory 2034 may be functionally connected to the electronic device 2000 via various interfaces. The electronic device 2000 may further include a storage device (or a storage medium), such as a hard drive.

The sensor module 2040 may measure a physical quantity or detect an operation status of the electronic device 2000, and convert the measured or detected information to an electric signal. The sensor module 2040 may include at least one of, for example, a gesture sensor 2040A, a gyro sensor 2040B, an atmospheric pressure sensor 2040C, a magnetic sensor 2040D, an acceleration sensor 2040E, a grip sensor 2040F, a proximity sensor 2040G, a color sensor 2040H (e.g., an RGB sensor), a biometric sensor 2040I, a temperature/humidity sensor 2040J, a illuminance sensor 2040K, and an ultraviolet (UV) sensor 2040M. Additionally or alternatively, the sensor module 2040 may include, for example, an E-noise sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), or a finger print sensor (not shown). The sensor module 2040 may further include a control circuit for controlling its one or more sensors.

The input device 2050 may include a touch panel 2052, a (digital) pen sensor 2054, a key 2056, or an ultrasonic input device 2058. For example, the touch panel 2052 may recognize touch input using at least one of capacitive, resistive, infrared, and ultrasonic wave techniques. In addition, the touch panel 2052 may further include a control circuit. The capacitive type may recognize physical contact or proximity. The touch panel 2052 may further include a tactile layer. In this case, the touch panel 2052 may provide a tactile response to the user.

The (digital) pen sensor 2054 may be implemented using, for example, the same or similar method as or to the user's touch input, or using a separate recognition sheet.

The key 2056 may include, for example, a physical button, an optical key, a keypad, and the like.

The ultrasonic input device 2058 is a device capable of obtaining data by detecting microwaves through a microphone (e.g., a microphone 2088) in the electronic device 2000 through an input tool which generates an ultrasonic signal, allows radio frequency identification. The electronic device 2000 may receive user input from an external device (e.g., a computer or a server) connected using the communication module 2020.

The display 2060 may include a panel 2062, a hologram device 2064, or a projector 2066. The panel 2062 may employ, for example, an LCD or an AMOLED. The panel 2062 may be implemented, for example, flexibly, transparently, or wearably. The panel 2062 may be constructed as the single module with the touch panel 2052. The hologram device 2064 may present a three-dimensional image in the air using interference of light. The projector 2066 may display the image by projecting the light onto a screen. The screen may be placed, for example, inside or outside the electronic device 2000.

The display 2060 may further include a control circuit for controlling the panel 2062, the hologram device 2064, or the projector 2066.

The interface 2070 may include, for example, an HDMI 2072, a USB 2074, an optical interface 2076, or a D-subminiature (D-sub) 2078. Additionally or alternatively, the interface 2070 may include, for example, mobile high-definition link (MHL) interface, SD card/multi-media card (MMC) interface, or Infrared Data Association (IrDA) standard interface.

The audio module 2080 may convert sound to an electric signal and vice versa. The audio module 2080 may process sound information which is input or output through, for example, a speaker 2082, a receiver 2084, an earphone 2086, or the microphone 2088.

The camera module 2091 is a device for capturing a still picture and a moving picture, and may include one or more image sensors (e.g., a top sensor or a bottom sensor), a lens (not shown), an image signal processor (ISP) (not shown), a flash (e.g., LED or xenon lamp) (not shown), and the like.

The power management module 2095 may manage power of the electronic device 2000. The power management module 2095 may include, although not depicted, for example, a power management integrated circuit (PMIC), a charger integrated circuit (IC), a battery or fuel gauge, and the like.

The PMIC may be mounted in, for example, an IC or an SoC conductor.

The charging type may be divided to a wired type and a wireless type. The charger IC may charge the battery, and prevent overvoltage or overcurrent flow from the charger. The charger IC may include a charger IC for at least one of the wired charging type or the wireless charging type. The wireless charging type includes, for example, a magnetic resonance type, a magnetic induction type, or a microwave type, and may add an additional circuit for the wireless charging, for example, a circuit, such as a coil loop, a resonance circuit, a rectifier, and the like.

The battery gauge may, for example, measure the remaining capacity of the battery 2096 and the voltage, the current, or the temperature of the charging. The battery 2096 may generate or store electricity, and supply the power to the electronic device 200 using the stored or generated electricity. The battery 2096 may include, for example, a rechargeable battery or a solar battery The indicator 2097 may display a specific status of the electronic device 2000 or its part, for example, a booting state, a message state, a charging state, and the like. The motor 2099 may convert the electric signal to a mechanic vibration. Although it is not depicted, the electronic device 2000 may include a processing device (e.g., a GPU) for mobile TV support. The processing device for the mobile TV support may process media data in conformity to a standard, for example, digital multimedia broadcasting (DMB), digital video broadcasting (DVB), media flow, and the like.

At least one of the various components of FIG. 20 may be installed in the electronic device 2000 using a connector, and the AP 2010 may detect the connection failure of the connector using at least one of FIG. 1 through FIG. 19.

An external electronic device may be connected through the interface 2070, and the AP 2010 may detect the connection failure of the external electronic device using at least one of FIG. 1 through FIG. 19.

According to an embodiment of the present disclosure, an electronic device may include a first connector configured to couple with a second connector and comprising a plurality of contacts separated from each other, and a processor configured to detect an incomplete connection between the first connector and the second connector when an electric current does not flow through at least one of the contacts.

According to an embodiment of the present disclosure, the at least one contact may be preset.

According to an embodiment of the present disclosure, the at least one preset contact may be disposed relatively outwards or relatively inwards among the contacts.

According to an embodiment of the present disclosure, the contacts may be arranged in a row.

According to an embodiment of the present disclosure, the at least one contact may be the same as or different from the other contacts in a shape.

According to an embodiment of the present disclosure, the at least one contact may not relatively protrude when compared with the other contacts, in a direction of coupling the first connector to the second connector.

According to an embodiment of the present disclosure, when a connection distance at one or more joints between the first connector and the second connector may be greater than a reference distance, an electric current does not flow through the at least one contact.

According to an embodiment of the present disclosure, the second connector may be disposed in the electronic device or in an external electronic device.

The first connector may be electrically mounted on a circuit board inside the electronic device.

According to an embodiment of the present disclosure, the first connector may be electrically connected to a first circuit board inside the electronic device, and the second connector may be electrically connected to a second circuit board inside the electronic device.

According to an embodiment of the present disclosure, the electronic device may further include a bracket disposed between the first circuit board and the second circuit board, wherein the first connector and the second connector are connected through a through hole of the bracket.

According to an embodiment of the present disclosure, the electronic device may further include a display electrically connected to the first circuit board, wherein the first circuit board is disposed between the display and the second circuit board.

According to an embodiment of the present disclosure, the processor may detect no electric current flow through at least one of the contacts using a circuit comprising a pull-up resistor.

According to an embodiment of the present disclosure, the first connector may include one of a socket connector and a header connector.

According to an embodiment of the present disclosure, the electronic device may further include an output device, wherein the processor transmits to the output device a signal corresponding to an incomplete connection between the first connector and the second connector, and the output device outputs an image or a sound corresponding to the signal.

According to an embodiment of the present disclosure, a method for operating an electronic device comprising a first connector and a second connector, may include detecting no electric current flow of at least one of joints between the first connector and the second connector, and, in response to no electric current flow detected, notifying a connection failure between the first connector and the second connector.

According to an embodiment of the present disclosure, the at least one of the joints may be preset.

According to an embodiment of the present disclosure, notifying the connection failure between the first connector and the second connector may include identifying a first device corresponding to the first connector and a second device corresponding to the second connector, and outputting the connection failure between the first connector and the second connector using an image or a sound.

According to an embodiment of the present disclosure, both of the first device and the second device may be mounted in the electronic device.

According to an embodiment of the present disclosure, the first device may be mounted in the electronic device, and the second device may be mounted in an external electronic device.

The aforementioned components of the electronic device according to various embodiments of the present disclosure each may include one or more components, and the name of the corresponding component may differ according to the type of the electronic device. The present electronic device may include at least one of the aforementioned components, omit some components, or further include other components. In addition, some of the components of the present electronic device may be united into a single entity to thus carry out the same functions of the corresponding components.

The term "module" used in an embodiment of the present disclosure indicates, for example, a unit including a combination of one or more of hardware, software, or firmware. The "module" may be interchangeably used with the terms, for example, "a unit," "logic," "a logical block," "a component," or "a circuit." The "module" may be a minimum unit or part of the components integrally formed. The "module" may be a minimum unit or part of one or more functions. The "module" may be implemented mechanically or electronically. For example, the "module" may include at least one of an application-specific integrated circuit (ASIC), a field-programmable gate array (FPGA), a programmable-logic device, and the like, for performing operations which are well known or will be developed.

At least part of the device (e.g., the modules or the functions) or the method (e.g., the operations) described in the appended claims and/or the specification of the present disclosure may be implemented using, for example, instructions stored as the programming module in a non-transitory computer-readable storage medium. For example, when an instruction is executed by one or more processors (e.g., the processor 2010), the one or more processors perform the corresponding function. The non-transitory computer-readable storage medium may be, for example, the memory 2030. At least part of the programming module may be implemented (e.g., executed) by the processor 2010. At least part of the programming module may include, for example, a module, a program, sets of instructions, a process for performing one or more functions, and the like.

Certain aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

As set forth above, the product error rate of the electronic device may be reduced by detecting in advance the incomplete connection between the connectors.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a printed circuit board (PCB) including a processor;
a display and a display circuit board for controlling an image output via the display under control of the processor, the display circuit board being disposed between the display and the PCB;
a first connector electrically connected to the PCB and comprising a plurality of first contacts; and
a second connector electrically connected to the display circuit board and comprising a plurality of second contacts,
wherein the processor is configured to detect an incomplete connection between the first connector and the second connector when an electric current does not flow between at least one preset contact of the first contacts and at least one preset contact of the second contacts.

2. The electronic device of claim 1, wherein the at least one preset contact of the first contacts is disposed relatively outwards or relatively inwards among the first contacts.

3. The electronic device of claim 1, wherein the plurality of first contacts are arranged in a row.

4. The electronic device of claim 1, wherein the at least one preset contact of the first contacts is different from the other contacts in a shape.

5. The electronic device of claim 1, wherein the at least one preset contact of the first contacts does not relatively protrude when compared with the other contacts, in a direction of coupling the first connector to the second connector.

6. The electronic device of claim 1, wherein, when a connection distance at one or more joints between the first connector and the second connector is greater than a reference distance, an electric current does not flow between the at least one preset contact of the first contacts and the preset contact of the second contacts.

7. The electronic device of claim 1, wherein the first connector is electrically mounted on the PCB.

8. The electronic device of claim 1, further comprising:
a bracket disposed between the display circuit board and the PCB,
wherein the first connector and the second connector are connected through a through hole of the bracket.

9. The electronic device of claim 1, wherein the processor is further configured to detect no electric current flow between the at least one preset contact of the first contacts and the at least one preset contact of the second contacts based on a circuit comprising a pull-up resistor.

10. The electronic device of claim 1,
wherein the processor is further configured to notify the incomplete connection between the first connector and the second connector through the display.

11. The electronic device of claim 1, wherein the first connector comprises a socket connector and the second connector comprises a header connector.

12. A method for operating an electronic device including a printed circuit board (PCB) including a processor, a display and a display circuit board for controlling an image output via the display under control of the processor, the display circuit board being disposed between the display and the PCB, a first connector electrically connected to the PCB and comprising a plurality of first contacts, and a second connector electrically connected to the display circuit board and comprising a plurality of second contacts, the method comprising:
detecting, by the processor, an incomplete connection between the first connector and the second connector when an electric current does not flow between at least one preset contact of the first contacts and at least one preset contact of the second contacts.

13. The method of claim 12, further comprising:
notifying, by the processor, the incomplete connection between the first connector and the second connector through the display.

14. The method of claim 12,
wherein the electronic device further includes a bracket disposed between the display circuit board and the PCB, and
wherein the first connector and the second connector are connected through a through hole of the bracket.

15. The method of claim 12, wherein the first connector comprises a socket connector and the second connector comprises a header connector.

* * * * *